US008994621B2

(12) United States Patent
Kishi et al.

(10) Patent No.: US 8,994,621 B2
(45) Date of Patent: *Mar. 31, 2015

(54) DISPLAY DEVICE AND METHOD FOR DRIVING SAME

(75) Inventors: Noritaka Kishi, Osaka (JP); Noboru Noguchi, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 202 days.

This patent is subject to a terminal disclaimer.

(21) Appl. No.: 13/808,324

(22) PCT Filed: Jun. 1, 2011

(86) PCT No.: PCT/JP2011/062581
§ 371 (c)(1),
(2), (4) Date: Jan. 4, 2013

(87) PCT Pub. No.: WO2012/008232
PCT Pub. Date: Jan. 19, 2012

(65) Prior Publication Data
US 2013/0106823 A1    May 2, 2013

(30) Foreign Application Priority Data

Jul. 12, 2010   (JP) .................................. 2010-157625
Sep. 10, 2010  (JP) .................................. 2010-202702

(51) Int. Cl.
G09G 3/30     (2006.01)
G09G 3/32     (2006.01)
H01L 27/32    (2006.01)

(52) U.S. Cl.
CPC .......... *G09G 3/3258* (2013.01); *H01L 27/3276* (2013.01); *G09G 3/3233* (2013.01);
(Continued)

(58) Field of Classification Search
CPC .............. G09G 2310/0256; G09G 2300/0866; G09G 2310/0262; G09G 3/3291; G09G 2320/0233; G09G 3/003; G09G 3/3266; G09G 2300/0814; G09G 2300/0417; G09G 3/3208; G09G 2320/0295; G09G 3/3283; G09G 2300/043; G09G 2300/0809; G09G 2300/0857; G09G 2360/148; G09G 3/3648; G09G 3/3233; G09G 2300/0852; G09G 2300/0861; G09G 2310/0283; G09G 3/3275; G06F 3/0412; G06F 3/042
USPC .............................. 345/76–82, 211, 690, 204
See application file for complete search history.

(56) References Cited

U.S. PATENT DOCUMENTS 8,325,111 B2 * 12/2012 Kimura ........................... 345/76
2001/0055828 A1 12/2001 Kaneko et al.
(Continued)

FOREIGN PATENT DOCUMENTS

JP   2002-091376 A    3/2002
JP   2006-133731 A    5/2006
(Continued)

OTHER PUBLICATIONS

International Search Report received for PCT Patent Application No. PCT/JP2011/062581, mailed on Aug. 30, 2011, 5 pages. (2 pages of English Translation and 3 pages of Original Search Report).
(Continued)

Primary Examiner — Duc Dinh
(74) Attorney, Agent, or Firm — Morrison & Foerster LLP

(57) ABSTRACT

A display device (100) includes a plurality of pixel circuits (10), a gate driver circuit (2) coupled to a plurality of scanning signal lines $G_i$ and a plurality of control lines $E_i$, and a power control circuit (4) coupled to a plurality of power lines $VP_i$ via a common power line. The pixel circuits (10) each include an organic EL element, a plurality of TFTs, and a capacitor, and are controlled to collectively receive initialization potentials at the beginning of a frame through the power lines $VP_i$, collectively perform threshold detection immediately thereafter, and then perform writing and light-emission operations. Thus, the aperture ratio of the pixel circuits (10) can be kept high, the power control circuit (4) typically has only one output buffer so that the circuit scale thereof is small, drive by potential is performed only once, so that power consumption is low, and threshold detection is performed only once, so that a sufficient amount of time can be ensured for a detection period.

12 Claims, 15 Drawing Sheets

(52) U.S. Cl.
CPC .............. *G09G2300/0819* (2013.01); *G09G 2300/0842* (2013.01); *G09G 2300/0861* (2013.01); *G09G 2300/0866* (2013.01); *G09G 2310/0205* (2013.01); *G09G 2310/0218* (2013.01); *G09G 2310/0256* (2013.01); *G09G 2320/0252* (2013.01)
USPC .............. 345/76; 345/77; 345/78; 315/169.3

(56) References Cited

U.S. PATENT DOCUMENTS

| | | |
|---|---|---|
| 2006/0097966 A1 | 5/2006 | Choi |
| 2006/0290614 A1 | 12/2006 | Nathan et al. |
| 2007/0115225 A1 | 5/2007 | Uchino et al. |
| 2007/0268210 A1 | 11/2007 | Uchino et al. |
| 2008/0030436 A1 | 2/2008 | Iida et al. |
| 2009/0109146 A1 | 4/2009 | Minami et al. |
| 2009/0135111 A1 | 5/2009 | Yamamoto et al. |
| 2009/0207160 A1 | 8/2009 | Shirasaki et al. |
| 2009/0244050 A1 | 10/2009 | Yamamoto et al. |
| 2009/0244055 A1 | 10/2009 | Asano et al. |
| 2009/0278771 A1 | 11/2009 | Yamamoto et al. |
| 2010/0007645 A1 | 1/2010 | Ono |
| 2010/0091207 A1 | 4/2010 | Hasegawa et al. |
| 2010/0149153 A1 | 6/2010 | Yamamoto et al. |
| 2011/0316892 A1 | 12/2011 | Sung et al. |

FOREIGN PATENT DOCUMENTS

| | | |
|---|---|---|
| JP | 2006-215275 A | 8/2006 |
| JP | 2007-148129 A | 6/2007 |
| JP | 2007-156460 A | 6/2007 |
| JP | 2007-310311 A | 11/2007 |
| JP | 2007-316453 A | 12/2007 |
| JP | 2008-33193 A | 2/2008 |
| JP | 2008-51990 A | 3/2008 |
| JP | 2009-133914 A | 6/2009 |
| JP | 2009-192854 A | 8/2009 |
| JP | 2009-237041 A | 10/2009 |
| JP | 2009-244666 A | 10/2009 |
| JP | 2010-54564 A | 3/2010 |
| JP | 2010-145578 A | 7/2010 |
| KR | 10-2012-0000887 | 1/2012 |
| WO | WO-2008/152817 A1 | 12/2008 |

OTHER PUBLICATIONS

International Search Report received for PCT Application No. PCT/JP2011/073781, mailed on Jan. 17, 2012, 5 pages (2 pages of English Translation and 3 pages of Original Search Report).

Written Opinion received for PCT Application No. PCT/JP2011/073781, mailed on Jan. 17, 2012, 9 pages (5 pages of English Translation and 4 pages of Original Written Opinion).

\* cited by examiner

DISPLAY DEVICE AND METHOD FOR DRIVING SAME

CROSS REFERENCE TO RELATED APPLICATIONS

This is a U.S. National Phase patent application of PCT/JP2011/062581, filed Jun. 1, 2011, which claims priority to Japanese Patent Applications No. 2010-157625, filed Jul. 12, 2010, and No. 2010-202702, filed Sep. 10, 2010, each of which is hereby incorporated by reference in the present disclosure in its entirety.

TECHNICAL FIELD

The present invention relates to display devices, and more specifically, the invention relates to a display device, such as an organic EL display, which includes self-luminous elements driven by current, and a method for driving the same.

BACKGROUND ART

Organic EL (electroluminescent) displays are conventionally known as being thin display devices featuring high image quality and low power consumption. The organic EL display has a plurality of pixel circuits arranged in a matrix, each circuit including an organic EL element, which is a self-luminous element driven by current, and a drive transistor for driving the element.

The method for controlling the amount of current to be applied to a current-driven display element such as the organic EL element is generally classified into a constant-current control mode (or current-programmed drive mode) in which the current to be applied to a display element is controlled by a data signal current applied to a data signal line electrode of the display element, and a constant-voltage control mode (or voltage-programmed drive mode) in which the current to be applied to a display element is controlled by a voltage corresponding to a data signal voltage. Among these modes, when the constant-voltage control mode is used for display on an organic EL display, it is necessary to compensate for current reduction (luminance decrease), which is caused by variations in the threshold voltage among drive transistors and high resistance due to deterioration of organic EL elements over time. On the other hand, in the constant-current control mode, the current value of the data signal is controlled such that current is applied to the organic EL element at a constant level regardless of the threshold voltage and the internal resistance of the organic EL element, and therefore compensation as mentioned above is normally not required. However, more drive transistors and lines are used in the constant-current control mode than in the constant-voltage control mode, resulting in a reduced aperture ratio, hence wide use of the constant-voltage control mode.

Here, there are various conventionally known types of pixel circuit that perform compensation operations as mentioned above in the configuration employing the constant-voltage control mode. Japanese Laid-Open Patent Publication No. 2006-215275 describes a pixel circuit 80 shown in FIG. 21. The pixel circuit 80 includes TFTs (thin-film transistors) 81 to 85, a capacitor 86, and an organic EL element 87. To perform writing to the pixel circuit 80, first, the TFTs 82 and 84 are brought into ON state, thereby initializing a gate-source voltage of the TFT 85 (drive transistor). Next, the TFT 84 is brought into OFF state, and then the TFT 83 is brought into OFF state, so that a threshold voltage of the TFT 85 is held by the capacitor 86. Subsequently, a data potential is applied to a data line DTL, and also the TFT 81 is brought into ON state. By controlling the TFTs in this manner, it is rendered possible to compensate for variations in the threshold voltage among TFTs 85 and high resistance (and resulting current reduction), which occurs due to deterioration of organic EL elements 87 over time.

The pixel circuit 80 is connected to the data line DTL, four control lines WSL, AZL1, AZL2, and DSL, and three power lines (lines for Vofs, Vcc, and Vss). In general, as the number of lines (particularly, control lines) connected to the pixel circuit increases, the circuit becomes more complicated, resulting in increased production cost. Therefore, the pixel circuit described in Japanese Laid-Open Patent Publication No. 2006-215275 has the TFT 82 or 84 connected at its source terminal to the control line WSL. Also, Japanese Laid-Open Patent Publication No. 2007-316453 describes a pixel circuit in which the TFT 82 is connected at its gate terminal to a control line WSL for an immediately preceding row. By commonly using a line as both the control line and the power line, the number of lines used can be reduced.

Japanese Laid-Open Patent Publication No. 2007-310311 describes a pixel circuit 90 shown in FIG. 22. The pixel circuit 90 includes a TFT 91, a TFT 92, a capacitor 93, and an organic EL element 94. To perform writing to the pixel circuit 90, first, the TFT 91 is controlled to be in ON state. Next, an initialization potential is applied to a power line DSL and thereby to an anode terminal of the organic EL element 94. Then, a power potential is applied to the power line DSL, so that a threshold voltage of the TFT 92 (drive transistor) is held by the capacitor 93. Subsequently, a data potential is applied to a data line DTL. Such provision of the initialization potential through the power line makes it possible for a small number of elements to achieve compensation for variations in the threshold voltage among TFTs 92. Japanese Laid-Open Patent Publication No. 2007-148129 describes a pixel circuit to which an initialization potential is provided through a power line and a reference potential is provided through a data line. Japanese Laid-Open Patent Publication No. 2008-33193 describes a pixel circuit in which a compensation operation is performed in a plurality of horizontal periods before writing.

CITATION LIST

Patent Documents

Patent Document 1: Japanese Laid-Open Patent Publication No. 2006-215275
Patent Document 2: Japanese Laid-Open Patent Publication No. 2007-316453
Patent Document 3: Japanese Laid-Open Patent Publication No. 2007-310311
Patent Document 4: Japanese Laid-Open Patent Publication No. 2007-148129
Patent Document 5: Japanese Laid-Open Patent Publication No. 2008-33193

SUMMARY OF THE INVENTION

Problems to be Solved by the Invention

By applying the method described in Japanese Laid-Open Patent Publication No. 2006-215275 or 2007-316453 to the pixel circuit 80 shown in FIG. 21, it is rendered possible to reduce the number of lines to be connected to the pixel circuit. However, the pixel circuit resulting from such a method has a problem with a higher number of TFTs. On the other hand, the pixel circuit 90 shown in FIG. 22 has a smaller number of TFTs. However, when the pixel circuit 90 is used, the power line DSL needs to be driven in conjunction with the control line WSL. Accordingly, a power control circuit requires output buffers the number of which is the same as the power lines WSL. In addition, the potential of the power lines DSL needs to change at short intervals in accordance with periods in which the control lines WSL are selected, and therefore the output buffers provided in the power control circuit need high current drive capability. As a result, the pixel circuit 90 has a problem with an increased scale and power consumption of the power control circuit.

Furthermore, application of the method described in Japanese Laid-Open Patent Publication No. 2008-33193 can ensure a sufficient amount of time for a compensation operation but results in a complicated configuration, and if the operation of compensating for a threshold voltage (also called "threshold detection") is performed in a selection period as in other conventional methods described above, the configuration can be simplified, but a sufficient amount of time cannot be ensured for a compensation operation.

Therefore, an objective of the present invention is to provide a display device capable of reducing the scale and power consumption of a power control circuit while maintaining a high aperture ratio of pixel circuits, and also capable of ensuring a sufficient amount of time for threshold detection with a simplified configuration.

Solution to the Problems

A first aspect of the present invention is directed to an active-matrix display device comprising:
a plurality of video signal lines for transmitting signals representing an image to be displayed;
a plurality of scanning signal lines and control lines crossing the video signal lines;
a plurality of pixel circuits for forming the image to be displayed, the circuits being arranged in a matrix so as to correspond to intersections of the video signal lines and the scanning signal lines;
a plurality of power lines for supplying power potentials to the pixel circuits;
a scanning signal line driver circuit for selectively or collectively driving the scanning signal lines and the control lines;
a video signal line driver circuit for driving the video signal lines by applying thereto the signals representing the image to be displayed; and
a power control circuit for driving the power lines, wherein, the pixel circuit includes:
   an electro-optic element to be driven by current provided via the power line;
   a drive transistor provided in a current path through the electro-optic element, to determine current that is to flow through the path;
   a write control transistor provided between a control terminal of the drive transistor and the video signal line, to connect the control terminal of the drive transistor and the video signal line when the scanning signal line driver circuit drives and activates the scanning signal line;
   an emission control transistor provided between one conductive terminal of the drive transistor and the power line, to connect that conductive terminal and the power line when the scanning signal line driver circuit drives and activates the control line; and
   a capacitor provided between the other conductive terminal of the drive transistor and the control terminal, and
the scanning signal line driver circuit collectively drives and activates at least a part of the scanning signal lines and at least a part of the control lines, and thereafter selectively drives the scanning signal lines, thereby displaying the image, the at least a part of the scanning signal lines being collectively driven and activated in an initialization period in which to initialize the electro-optic elements and in a threshold detection period in which to compensate for a threshold voltage of the drive transistors, the initialization period being set so as to be later than a start of a frame period preceding display of the image, the threshold detection period being set so as to be later than the initialization period, the at least a part of the control lines being collectively driven and activated in the threshold detection period.

In a second aspect of the present invention, based on the first aspect of the invention, the power control circuit provides the power lines with initialization potentials to initialize the electro-optic elements in the initialization period and with the power potentials except in the initialization period, and the scanning signal line driver circuit collectively drives and activates the at least a part of the control lines in the initialization period.

In a third aspect of the present invention, based on the second aspect of the invention, the scanning signal lines and the control lines are divided into a plurality of groups, the scanning signal line driver circuit collectively drives and activates one of the groups of scanning signal lines and one of the groups of control lines in the initialization period and the threshold detection period, and aside from the initialization period and the threshold detection period, one or more different initialization periods and one or more different threshold detection periods are set in which a different group of scanning signal lines and a different group of control lines are collectively driven and activated.

In a fourth aspect of the present invention, based on the third aspect of the invention, each time the scanning signal lines to be selectively driven and activated to display the image are each finished selecting, the scanning signal line driver circuit drives and activates the control lines corresponding to the scanning signal lines, such that the emission control transistors are made conductive approximately for the same duration.

In a fifth aspect of the present invention, based on the third aspect of the invention, to avoid any two power lines in the same one of the divided groups of power lines being adjacent to each other, the power lines are sequentially provided one by one from different groups.

In a sixth aspect of the present invention, based on the third aspect of the invention, the display device further includes one common power line provided for each group of power lines such that the common power line is commonly connected to that group, and in the initialization period or in the different initialization period, the power control circuit provides the groups of power lines with the initialization potentials via their respective corresponding common power lines.

In a seventh aspect of the present invention, based on the second aspect of the invention, the emission control transistors are made conductive approximately for the same duration by:
in at least a part of a time period after the threshold detection period until at least a part of the scanning signal lines being each finished selecting, the scanning signal line driver circuit driving and deactivating at least a part of the control lines corresponding to the at least a part of the scanning signal lines; and the scanning signal line driver circuit thereafter collectively driving and activating the at least a part of the control lines in at least a part of a time period until the start of the next initialization period.

In an eighth aspect of the present invention, based on the seventh aspect of the invention, the scanning signal lines and the control lines are divided into a plurality of groups, the scanning signal line driver circuit collectively drives and activates one of the groups of scanning signal lines and one of the groups of control lines in the initialization period and the threshold detection period, aside from the initialization period and the threshold detection period, one or more different initialization periods and one or more different threshold detection periods are set in which a different group of scanning signal lines and a different group of control lines are collectively driven and activated, in at least a part of a time period after the different threshold detection period until the different group of scanning signal lines being completely selected, the scanning signal line driver circuit drives and deactivates a group of control lines corresponding to the different group of scanning signal lines, and the scanning signal line driver circuit thereafter collectively drives and activates the group of control lines in at least a part of a time period until the start of the next different initialization period.

In a ninth aspect of the present invention, based on the seventh aspect of the invention, the display device further includes at least one common control line commonly connected to at least a part of the control lines, and the scanning signal line driver circuit drives the common control line, thereby collectively driving the control lines.

In a tenth aspect of the present invention, based on the first aspect of the invention, the power control circuit only provides the power potentials to the power lines, and to apply current not greater than a threshold for the electro-optic elements, the video signal line driver circuit sets the potentials of all of the video signal lines to be high level and greater than a reference potential provided to control terminals of the drive transistors, and thereafter changes the potentials of all of the video signal lines to the level of the reference potential at a predetermined point in the initialization period with all of the control lines left deactivated.

In an eleventh aspect of the present invention, based on the first aspect of the invention, the display device further includes an auxiliary capacitor connected parallel to the electro-optic element.

A twelfth aspect of the present invention is directed to a method for driving an active-matrix display device including a plurality of video signal lines for transmitting signals representing an image to be displayed, a plurality of scanning signal lines and control lines crossing the video signal lines, a plurality of pixel circuits for forming the image to be displayed, the circuits being arranged in a matrix so as to correspond to intersections of the video signal lines and the scanning signal lines, and a plurality of power lines for supplying power potentials to the pixel circuits, the method comprising:

a scanning signal line driving step of selectively or collectively driving the scanning signal lines and the control lines;

a video signal line driving step of driving the video signal lines by applying thereto the signals representing the image to be displayed; and a power control step of driving the power lines, wherein, the pixel circuit includes:

an electro-optic element to be driven by current provided via the power line;

a drive transistor provided in a current path through the electro-optic element, to determine current that is to flow through the path;

a write control transistor provided between a control terminal of the drive transistor and the video signal line, to connect the control terminal of the drive transistor and the video signal line when the scanning signal line is driven and activated in the scanning signal line driving step;

an emission control transistor provided between one conductive terminal of the drive transistor and the power line, to connect that conductive terminal and the power line when the control line is driven and activated in the scanning signal line driving step; and a capacitor provided between the other conductive terminal of the drive transistor and the control terminal, and in the scanning signal line driving step, at least a part of the scanning signal lines and at least a part of the control lines are collectively driven and activated, and thereafter the scanning signal lines are selectively driven, thereby displaying the image, the scanning signal lines being collectively driven and activated in an initialization period in which to initialize the electro-optic elements and in a threshold detection period in which to compensate for a threshold voltage of the drive transistors, the initialization period being set so as to be later than a start of a frame period preceding display of the image, the threshold detection period being set so as to be later than the initialization period, the control lines being collectively driven and activated in the threshold detection period.

Effect of the Invention

According to the first aspect of the invention, the need for signal lines or suchlike for providing initialization potentials is eliminated, so that the number of elements in the pixel circuits can be reduced, and therefore, the aperture ratio does not decrease, and further, the need for the power control circuit to be driven, for example, each time the scanning signal line is selected, so that power consumption can be reduced, and the number of output buffers provided in the power control circuit can be reduced, resulting in a reduced circuit scale of the power control circuit. Moreover, the threshold detection period can be set to a suitable length, typically longer than the selection period, and therefore, threshold detection can be reliably performed, so that accuracy in threshold compensation can be enhanced. In addition, when compared to the configuration where threshold detection is performed in the selection period, a sufficient amount of time can be spared for writing pixel data. Therefore, for example, this configuration is particularly suitable for a three-dimensional image display device (typically, a 3D television) or suchlike where the writing period is short, i.e., high-speed drive is normally performed.

According to the second aspect of the invention, the circuit scale of the power control circuit can be reduced, power consumption can be reduced, and besides the initialization period can be set to a suitable length, typically longer than the selection period, so that even a power control circuit with relatively low drive capability can ensure a reliable initialization operation.

According to the third aspect of the invention, aside from the initialization period and the threshold detection period, a different initialization period and a different threshold detection period are set, typically so as to be later than (typically, immediately succeeding) the start of a frame period, and pixel circuits to be subjected to initialization and threshold detection operations in such periods are not required to finish emitting light at the end of the frame period, and therefore can be selected for image display until the end of the frame period. Thus, a sufficient amount of time can be ensured for a data writing period (selection period).

According to the fourth aspect of the invention, the emission period length can be equalized among all pixel circuits, thereby inhibiting variations in luminance. Moreover, since the pixel circuits are unlit except in the emission period, moving picture performance can be enhanced as in the case where black insertion is carried out.

According to the fifth aspect of the invention, in the configuration where different groups of power lines are provided such that two power lines in the same group are adjacent to each other, for example, when there is a significant difference in the amount of current flowing through the power line between the upper and lower halves of the screen, there might be a difference in luminance at the center of the screen. However, in the configuration where power lines are provided such that two power lines in the same group are not adjacent to each other, the amount of current flowing through the power line can be approximately averaged among a plurality of rows, so that such a difference in luminance that might occur at the screen center can be prevented.

According to the sixth aspect of the invention, the number of common power lines is equal to the number of outputs of the power control circuit, and therefore, for example, the number of output buffers provided in the power control circuit can be reduced, thereby reducing the circuit scale of the power control circuit.

According to the seventh aspect of the invention, the period from the end of threshold detection to the start of light emission is set to be equal for all rows, so that leakage current that occurs from the end of threshold detection can be approximately equalized among all rows of pixel circuits. As a result, the amount of decrease in luminance due to leakage current can be approximately equalized among all rows of pixel circuits, thereby inhibiting uneven display. Note that moving picture performance can be advantageously enhanced by black insertion, as in the fourth aspect of the invention.

According to the eighth aspect of the invention, uneven display can be advantageously inhibited, as in the seventh aspect of the invention, and further, a sufficient amount of time can be advantageously ensured for a data writing period (selection period), as in the third aspect of the invention.

According to the ninth aspect of the invention, the number of common control lines is equal to the number of control signal outputs of the scanning signal line driver circuit, so that the circuit scale of the scanning signal line driver circuit can be reduced and the area of wiring from the scanning signal line driver circuit to the control lines can be reduced.

According to the tenth aspect of the invention, the power control circuit is provided with only one output terminal, which simply outputs a constant power potential and is not driven at all, resulting in a reduced circuit scale of the power control circuit.

According to the eleventh aspect of the invention, the auxiliary capacitor is added parallel to the electro-optic element, ensuring that the capacitance value of the electro-optic element can be higher than that of the capacitor included in the pixel circuit (typically, it can be significantly high), thereby enhancing approximation accuracy of approximation formulae for use in threshold compensation, resulting in enhanced accuracy of threshold detection.

According to the twelfth aspect of the invention, the method for driving a display device can achieve similar effects to those achieved by the first aspect of the invention.

MODES FOR CARRYING OUT THE INVENTION

First Embodiment

Figure 1:
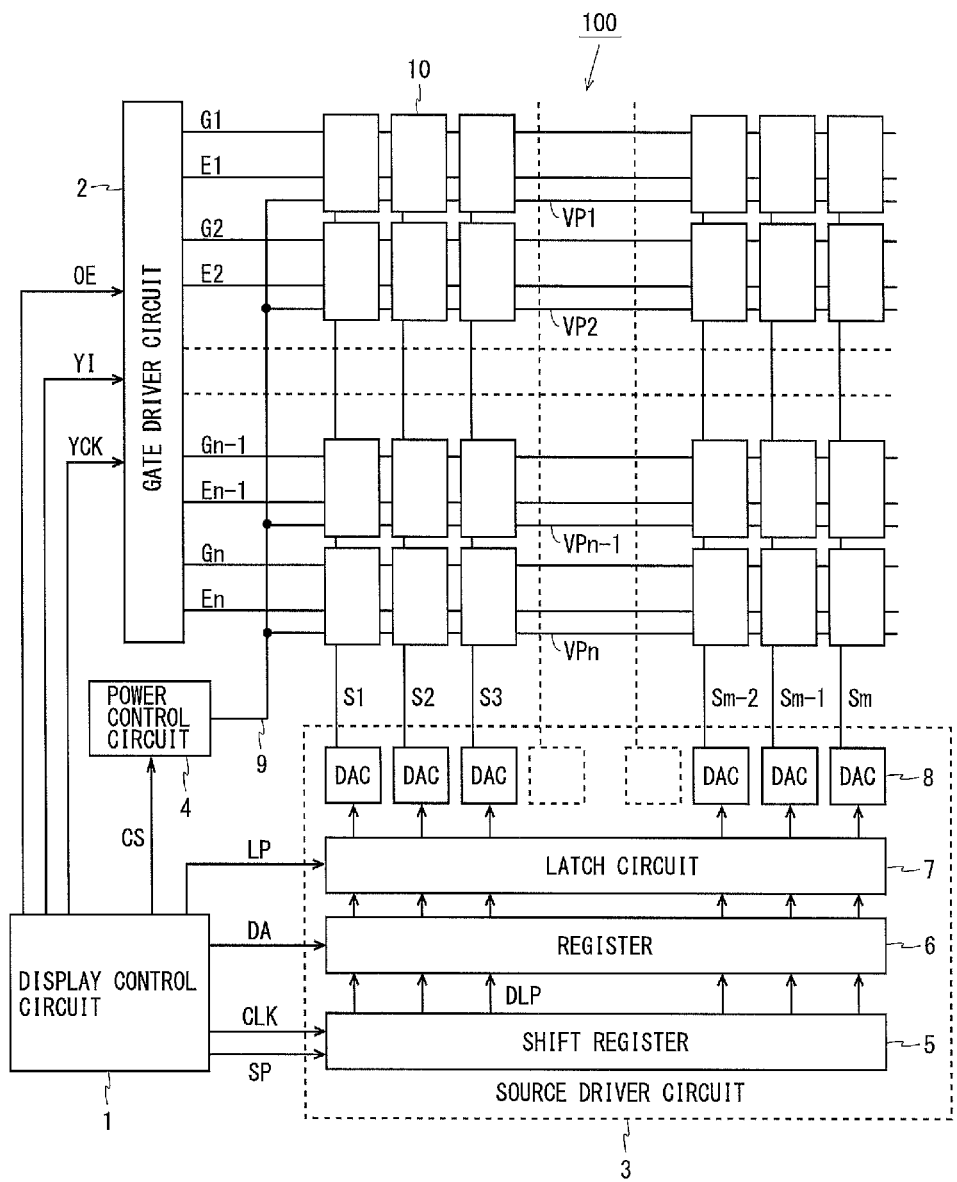
FIG. 1 is a block diagram illustrating the configuration of a display device according to a first embodiment of the present invention.

FIG. 1 is a block diagram illustrating the configuration of a display device according to a first embodiment of the present invention. The display device 100 shown in FIG. 1 is an organic EL display including a display control circuit 1, a gate driver circuit 2, a source driver circuit 3, a power control circuit 4, and (m×n) pixel circuits 10. Hereinafter, m and n are integers of 2 or more, i is an integer of 1 or more, and j is an integer of from 1 to m.

The display device 100 is provided with n parallel scanning signal lines $G_i$ and m parallel data lines $S_j$ perpendicular thereto. The (m×n) pixel circuits 10 are arranged in a matrix so as to correspond to intersections of the scanning signal lines $G_i$ and the data lines $S_j$. Moreover, n control lines $E_i$ and n power lines $VP_i$ are provided parallel to the scanning signal lines $G_i$. In addition, there is provided a common power line 9, which is a current supply bus line for connecting the power control circuit 4 to the power lines $VP_i$. The scanning signal lines $G_i$ and the control lines $E_i$ are connected to the gate driver circuit 2, and the data lines $S_j$ are connected to the source driver circuit 3. The power lines $VP_i$ are connected to the power control circuit 4 via the common power line 9. The pixel circuits 10 are supplied with a common potential Vcom by an unillustrated common electrode. Note that in the configuration here, the power lines $VP_i$ are connected at one end to the common power line 9, but they may be connected at both ends (or at three or more contacts).

The display control circuit 1 outputs control signals to the gate driver circuit 2, the source driver circuit 3, and the power control circuit 4. More specifically, the display control circuit 1 outputs a timing signal OE, a start pulse YI, and a clock YCK to the gate driver circuit 2, a start pulse SP, a clock CLK, a display data DA, and a latch pulse LP to the source driver circuit 3, and a control signal CS to the power control circuit 4.

The gate driver circuit 2 includes a shift register circuit, logical operation circuits, and buffers (none of which are shown). The shift register circuit sequentially transfers the start pulse YI in synchronization with the clock YCK. The logical operation circuits perform logical operations between the timing signal OE and pulses outputted from stages in the shift register circuit. The logical operation circuits provide outputs to their corresponding scanning signal lines $G_i$ and control lines $E_i$ by way of the buffers. Each scanning signal line $G_i$ is connected to m pixel circuits 10, which are collectively selected by using the scanning signal line $G_i$.

The source driver circuit 3 includes an m-bit shift registers, a register 6, a latch circuit 7, and m D/A converters 8. The shift register 5 has m registers cascaded in such a manner that the start pulse SP supplied to the first stage register is transferred in synchronization with the clock CLK, so that a timing pulse DLP is outputted from each stage register. The register 6 is supplied with display data DA at the same time as the output of the timing pulse DLP. The register 6 stores the display data DA in accordance with the timing pulse DLP. Once the register 6 stores display data DA for one row, the display control circuit 1 outputs a latch pulse LP to the latch circuit 7. Upon reception of the latch pulse LP, the latch circuit 7 holds the display data stored in the register 6. The D/A converters 8 are provided so as to correspond to the data lines $S_j$. Each D/A converter 8 converts the display data held in the latch circuit 7 into an analog voltage, and applies the analog voltage to the data line $S_j$.

In accordance with the control signal CS, the power control circuit 4 applies a power potential and an initialization potential to the common power line 9 while switching therebetween. As shown in FIG. 1, all power lines $VP_i$ are connected to one common power line 9, and therefore, all of the power lines $VP_i$ switch between the power potential and the initialization potential at the same time. It is assumed below that the power potential is a high-level potential, and the initialization potential is a low-level potential.

Figure 2:
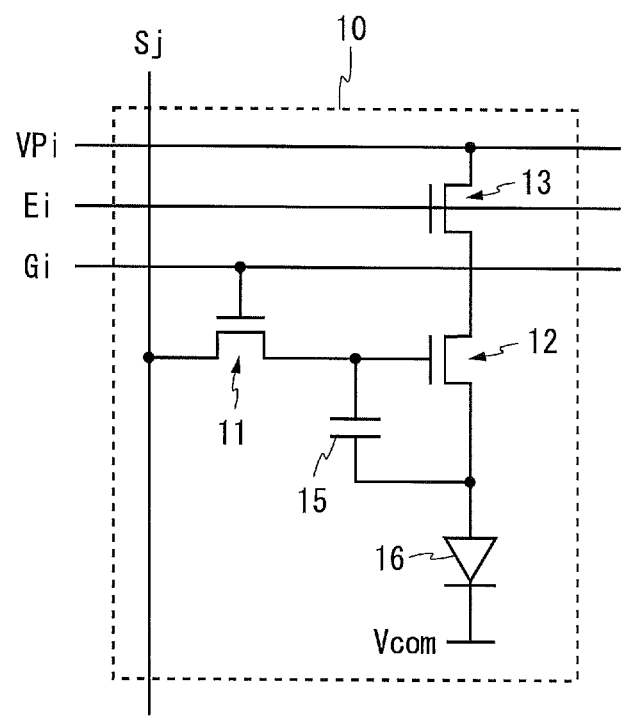
FIG. 2 is a circuit diagram of a pixel circuit in the embodiment.

FIG. 2 is a circuit diagram of the pixel circuit 10. As shown in FIG. 2, the pixel circuit 10 includes TFTs 11 to 13, a capacitor 15, and an organic EL element 16. The TFTs 11 to 13 are all n-channel transistors. The TFTs 11 to 13 function as a write control transistor, a drive transistor, and an emission control transistor, respectively. The organic EL element 16 functions as an electro-optic element.

Note that in addition to the organic EL element, the electro-optic element herein refers to any element whose optical characteristics change upon application of electricity, e.g., an FED (field emission display), an LED, a charge-driven element, a liquid crystal, or E Ink (electronic ink). Moreover, in the following description, the organic EL element will be exemplified as an electro-optic element, but the same description applies to any light-emitting element, so long as its amount of luminance is controlled in accordance with an amount of current.

As shown in FIG. 2, the pixel circuit 10 is connected to the scanning signal line $G_i$, the control line $E_i$, the data line $S_j$, the power line $VP_i$, and an electrode with a common potential Vcom. The TFT 11 has one conductive terminal connected to the data line $S_j$ and the other conductive terminal connected to a gate terminal of the TFT 12. The TFT 13 has a drain terminal connected to the power line $VP_i$ and a source terminal connected to a drain terminal of the TFT 12. The TFT 12 has a source terminal connected to an anode terminal of the organic EL element 16. The organic EL element 16 has a cathode terminal to which the common potential Vcom is applied. The capacitor 15 is provided between the gate terminal and the source terminal of the TFT 12. The TFT 11 has a gate terminal connected to the scanning signal line $G_i$, and the TFT 13 has a gate terminal connected to the control line $E_i$.

Figure 3:
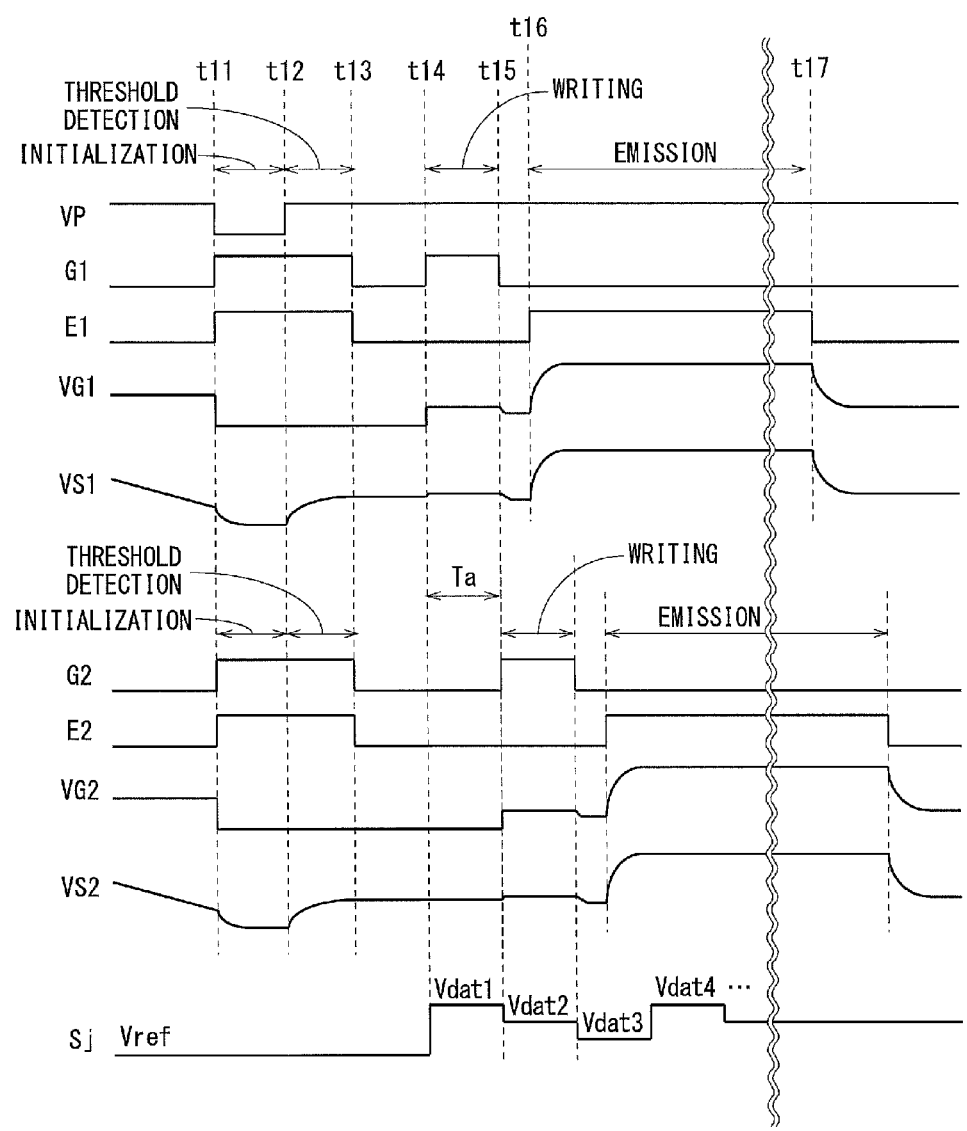
FIG. 3 is a diagram showing a timing chart describing a method for driving the pixel circuit in the embodiment.

FIG. 3 is a diagram showing a timing chart describing a method for driving the pixel circuit 10. In FIG. 3, $VG_i$ denotes a gate potential of a TFT 12 included in a pixel circuit in an i'th row, and $VS_i$ denotes a source potential of that TFT 12 (an anode potential of the organic EL element 16). The pixel circuit 10 performs each of the following operations once per frame period: initialization; threshold detection (detection of the threshold for the TFT 12); writing; and light emission, and the pixel circuit 10 is unlit except in the emission period. Although it is the organic EL element 16 that is lit up (and turned off), the pixel circuit 10 includes the organic EL element 16, and therefore, in the following, the pixel circuit 10 is described as being lit up or unlit. Moreover, the frame period is a unit period in which to display an image, which may include, for example, a black insertion period and can be set to various lengths.

Referring to FIG. 3, the operation of the pixel circuit in the first row will be described below. Prior to time $t_{11}$, scanning signal line $G_1$ and control line $E_1$ have low-level potentials, and power line $VP_1$ has a high-level potential. At time $t_{11}$, the potential of control line $E_1$ changes to high level (i.e., the line is activated), and the potential of power line $VP_1$ changes to low level (hereinafter, the low-level potential of the power line $VP_i$ will be denoted by "VP_L"). Used as the potential VP_L is a significantly low potential, specifically, a potential lower than the gate potential of the TFT 12 immediately before time $t_{11}$. Moreover, at this time, the data line $S_j$ has a reference potential Vref applied thereto, and this potential is provided to the gate of the TFT 12, so that the TFT 12 is brought into ON state. In addition, the TFT 13 is brought into ON state as well, so that source potential $VS_1$ of the TFT 12 is approximately equal to the potential VP_L.

At time $t_{12}$, the potential of power line $VP_1$ changes to high level. Moreover, at this time, the data line $S_j$ has the reference potential Vref applied thereto. The reference potential Vref is determined such that the TFT 12 is brought into ON state immediately after time $t_{12}$, and thereafter, a voltage applied to the organic EL element 16 does not exceed an emission threshold voltage. Accordingly, after time $t_{12}$, the TFT 12 is in ON state, but no current flows through the organic EL element 16 (because the threshold for the organic EL element 16 is not exceeded). Therefore, current flows from power line $VP_1$ through the TFT 13 to the TFT 12 and then to the source terminal thereof, so that source potential $VS_1$ of the TFT 12 rises. Source potential $VS_1$ of the TFT 12 rises and reaches (Vref−Vth) at the point where the gate-source voltage Vgs is equal to the threshold voltage Vth.

At time $t_{13}$, the potential of scanning signal line $G_1$ changes to low level. The potential of control line $E_1$ also changes to low level, so that after time $t_{13}$, the TFT 13 is in OFF state. As a result, source potential $VS_1$ of the TFT 12 remains approximately at (Vref−Vth).

At time $t_{14}$, the potential of scanning signal line $G_1$ changes to high level, and the potential (not shown) of the data line $S_j$ changes to a level in accordance with display data (hereinafter, the potential of the data line $S_j$ at this time will be referred to as the "data potential Vdat1"). After time $t_{14}$, the TFT 11 is in ON state, and gate potential $VG_1$ of the TFT 12 changes from Vref to Vdat1. The gate-source voltage Vgs of the TFT 12 after time $t_{14}$ is obtained by the following equation (1).

$$Vgs = \{C_{OLED}/(C_{OLED}+C_{st})\} \times (Vdat1-Vref)+Vth \quad (1)$$

Note that in equation (1), $C_{OLED}$ is a capacitance value of the organic EL element 16, and $C_{st}$ is a capacitance value of the capacitor 15.

The capacitance value of the organic EL element 16 is significantly high, hence $C_{OLED} \gg C_{st}$. Therefore, equation (1) can be transformed (or can approximate) to the following equation (2).

$$Vgs = Vdat1 - Vref + Vth \quad (2)$$

In this manner, when gate potential $VG_1$ of the TFT 12 changes from Vref to Vdat1, source potential $VS_1$ of the TFT 12 barely changes, so that the gate-source voltage Vgs of the TFT 12 is approximately equal to (Vdat1−Vref+Vth).

At time $t_{15}$, the potential of scanning signal line $G_1$ changes to low level. After time $t_{15}$, the TFT 11 is in OFF state. Therefore, the gate-source voltage Vgs of the TFT 12 remains approximately at (Vdat1−Vref+Vth) even when the potential of the data line $S_j$ changes.

At time $t_{16}$, the potential of control line $E_1$ changes to high level. After time $t_{16}$, the TFT 13 is in ON state, so that the drain terminal of the TFT 12 is connected to power line $VP_1$ via the TFT 13. At this time, the potential of power line $VP_1$ is high level, and therefore current flows from the power line $VP_i$ through the TFT 13 to the TFT 12 and then to the source terminal thereof, so that source potential $VS_1$ of the TFT 12 rises. At this point, the gate terminal of the TFT 12 is in floating state. Accordingly, when source potential $VS_1$ of the TFT 12 rises, gate potential $VG_1$ of the TFT 12 also rises. At this time, the gate-source voltage Vgs of the TFT 12 is maintained approximately at a constant level.

The high-level potential applied to the power line $VP_i$ is determined such that the TFT 12 operates in a saturated area in the emission period (from time $t_{16}$ to time $t_{17}$). Accordingly, without considering a channel-length modulation effect, current I flowing through the TFT 12 in the emission period can be obtained by the following equation (3).

$$I = \tfrac{1}{2} \cdot W/L \cdot \mu \cdot C_{ox}(Vgs-Vth)^2 \quad (3)$$

Note that in equation (3), W is a gate width, L is a gate length, $\mu$ is a carrier mobility, and $C_{ox}$ is a gate oxide film capacitance.

From equations (2) and (3), the following equation (4) can be derived.

$$I = \tfrac{1}{2} \cdot W/L \cdot \mu \cdot C_{ox}(Vdat1-Vref)^2 \quad (4)$$

Current I given by equation (4) changes in accordance with data potential Vdat1 but does not depend on the threshold voltage Vth of the TFT 12. Accordingly, even when there are variations in the threshold voltage Vth, or when the threshold voltage Vth changes over time, current is applied to the organic EL element 16 in accordance with data potential Vdat1, so that the organic EL element 16 can be lit up with a desired luminance.

At time $t_{17}$, the potential of control line $E_1$ changes to low level. After time $t_{17}$, the TFT 13 is in OFF state. Accordingly, no current flows through the organic EL element 16, so that the pixel circuit 10 is unlit.

In this manner, the pixel circuit in the first row performs initialization in the period from time $t_{11}$ to time $t_{12}$, threshold detection in the period from time $t_{12}$ to time $t_{13}$, and writing in the period from time $t_{14}$ to time $t_{15}$, and then emits light in the period from time $t_{16}$ to time $t_{17}$, and the pixel circuit in the first row is unlit except in the period from time $t_{16}$ to time $t_{17}$. As with the pixel circuit in the first row, the pixel circuit in the second row performs initialization in the period from time $t_{11}$ to time $t_{12}$, and threshold detection in the period from time $t_{12}$ to time $t_{13}$, and the writing and light-emission operations are performed with a delay of predetermined period $T_a$ compared to the pixel circuit in the first row. In general, the pixel circuit in the i'th row performs initialization and threshold detection in the same periods as pixel circuits in other rows, and performs the writing and light-emission operations with a delay of time $T_a$ compared to the pixel circuit in the (i−1)'th row.

Accordingly, the initialization period can be set to a suitable length, typically longer than a selection period, and therefore, even when the current capability of an output buffer included in the power control circuit 4a is low, the power control circuit 4a can perform the driving satisfactorily. Moreover, the threshold detection period can also be set to a suitable length, typically longer than the selection period, and therefore threshold detection can be reliably performed, so that accuracy in threshold compensation can be enhanced. In addition, when compared to the configuration where threshold detection is performed in the selection period, a sufficient amount of time can be spared for writing pixel data. Therefore, even in the case of, for example, a three-dimensional image display device (typically, a 3D television) where the writing period is short, i.e., high-speed drive is performed, the configuration of the present invention can be readily applied.

Figure 4:
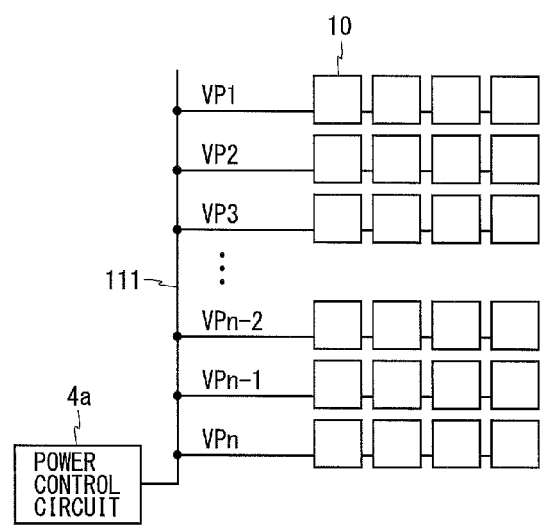
FIG. 4 is a diagram illustrating the connecting arrangement of power lines in the embodiment.

Connections of the power lines in the present embodiment and the operation of the pixel circuits 10 being driven by current applied via the power lines will be described next with reference to FIGS. 4 and 5. FIG. 4 is a diagram illustrating the connecting arrangement of power lines $VP_i$ in the display device according to the present embodiment. The display device shown in FIG. 4 is provided with one common power line 111 for connecting the power control circuit 4a to the power lines $VP_i$. The common power line 111 is connected at one end to an output terminal of the power control circuit 4a, and all of the power lines $VP_i$ are connected to the common power line 111.

Note that as described earlier, the common power line 111 is a bus line for current supply, but in the present embodiment, it does not have to be a bus line so long as all of the power lines $VP_i$ can be commonly connected to the power control circuit 4a, and the number of common power lines and their connecting points with the power lines $VP_i$ can be determined in accordance with any well-known configuration.

Figure 5:
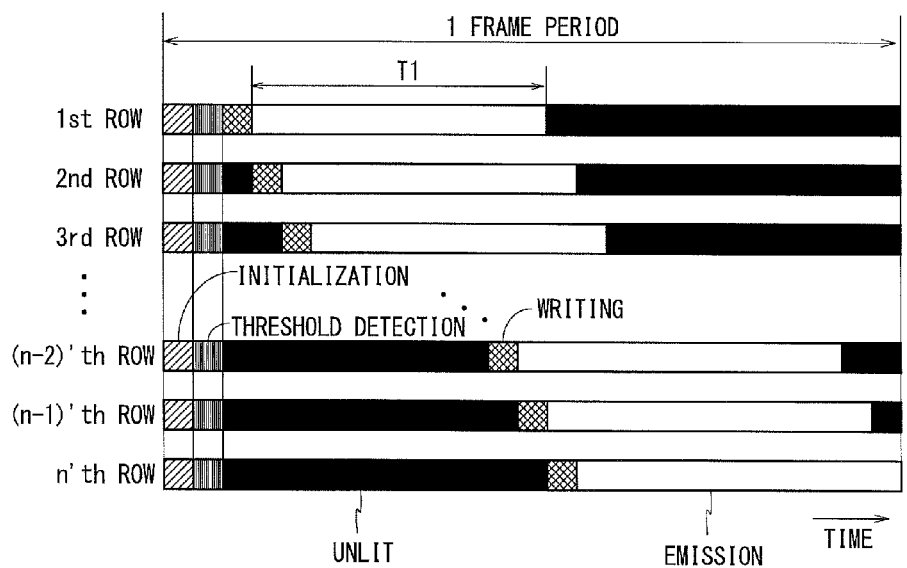
FIG. 5 is a diagram illustrating the operation of rows of pixel circuits in the embodiment.

FIG. 5 is a diagram illustrating the operation of rows of pixel circuits 10 in the display device according to the present embodiment. The power control circuit 4a applies a low-level potential to the common power line 111 for a predetermined period of time at the beginning of a frame period. Accordingly, the pixel circuits in all rows perform initialization at the beginning of the frame period. Immediately after initialization, the pixel circuits in all rows perform threshold detection. Subsequently, the pixel circuits in the first row are selected and perform writing. Next, the pixel circuits in the second row are selected and perform writing. Thereafter, similarly, the pixel circuits in the third through n'th rows are sequentially selected row by row, and the selected pixel circuits perform writing.

The pixel circuits in each row are unlit after threshold detection until immediately before writing. Here, the pixel circuits in each row need to be lit up for the same period of time, and the pixel circuits in the n'th row need to stop emitting light before the end of the frame period. Therefore, the pixel circuits in each row are lit up for a prescribed period of time T1 after writing, and they are unlit in other periods.

In a general display device, writing to the pixel circuit takes one frame period. On the other hand, in the configuration of the present embodiment shown in FIG. 5, about half a frame period is taken for writing to the pixel circuit (such that about half a frame period can be ensured for light emission). Therefore, the scanning speed of the pixel circuit is about twice the normal speed. Note that in this example, the emission period length T1 of the pixel circuit is about half a frame period, but it may be shorter than half a frame period while the scanning speed of the pixel circuit remains about twice the normal speed. Alternatively, the scanning speed of the pixel circuit may be set faster than about twice the normal speed, with the emission period length longer than half a frame period.

Furthermore, in the exemplary operation shown in FIG. 5, the emission period starts not long after data writing (e.g., at time $t_{16}$), but the start of the emission period may be later than that. Moreover, as shown in FIG. 6, the emission period may be set to start at the same time in all rows.

Figure 6:
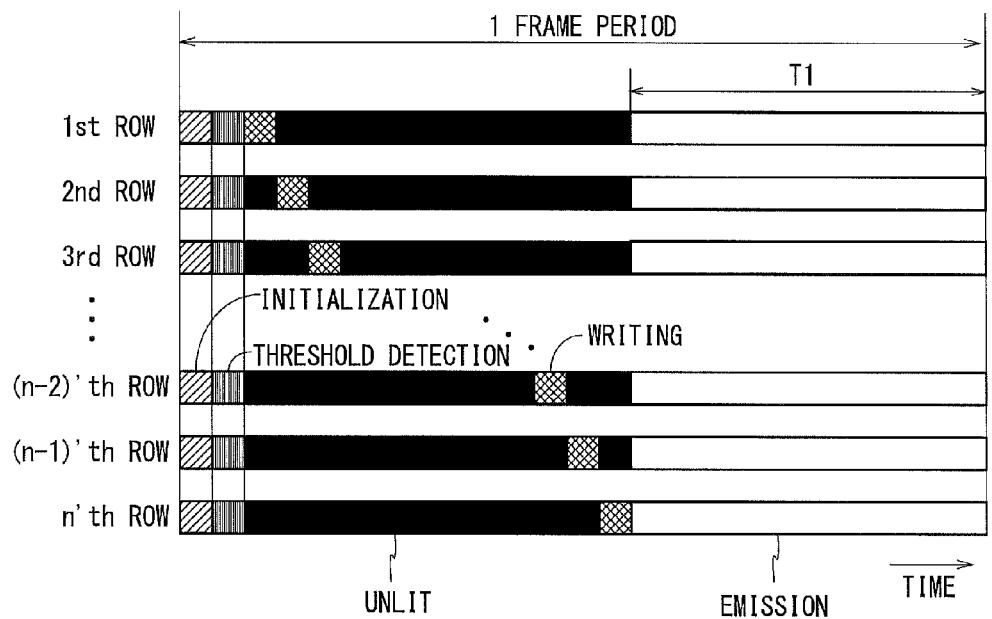
FIG. 6 is a diagram showing another example of the operation of rows of pixel circuits in the embodiment.

FIG. 6 shows another example of the operation of rows of pixel circuits 10. As can be appreciated in comparison with FIG. 5, in FIG. 6 also, the pixel circuits 10 perform each of the initialization, threshold detection (detection of the threshold for the TFT 12), writing, and light-emission operations once per frame period, and are unlit except in the emission period, but after the writing, the pixel circuits in each row are unlit for a predetermined different period of time from other rows, and then the pixel circuits in all rows are simultaneously (collectively) lit up for a prescribed period of time T1, and are turned off simultaneously at the end of the frame period (in other words, immediately before initialization in the next frame). In this manner, the period from the end of threshold detection to the start of light emission is set to be equal for all rows, so that uneven display can be inhibited.

Specifically, as described earlier in conjunction with FIG. 4, when the TFT 11 is in OFF state, the gate-source voltage Vgs of the TFT 12 remains approximately unchanged at (Vdat1−Vref+Vth) even if the potential of the data line $S_j$ changes. However, the TFT 12 slightly leaks current, so that the gate-source voltage Vgs in fact decreases slowly. Accordingly, the period from the end of threshold detection (which occurs at the same time in all rows) to the start of light emission is set to be equal for all rows, so that the leakage current from the TFT 12 can be approximately equalized among all rows of pixel circuits 10, and therefore the amount of decrease in luminance due to leakage current can be approximately equalized among all rows of pixel circuits 10, thereby inhibiting uneven display.

Here, in the case where the initialization, threshold detection, and light-emission operations are performed in the above manner, these operations occur at the same times in all rows, so that the same signals are used for activating (and deactivating) the control lines $E_i$. Accordingly, a common control line for connecting all control lines may be provided, as shown in FIG. 7.

Figure 7:
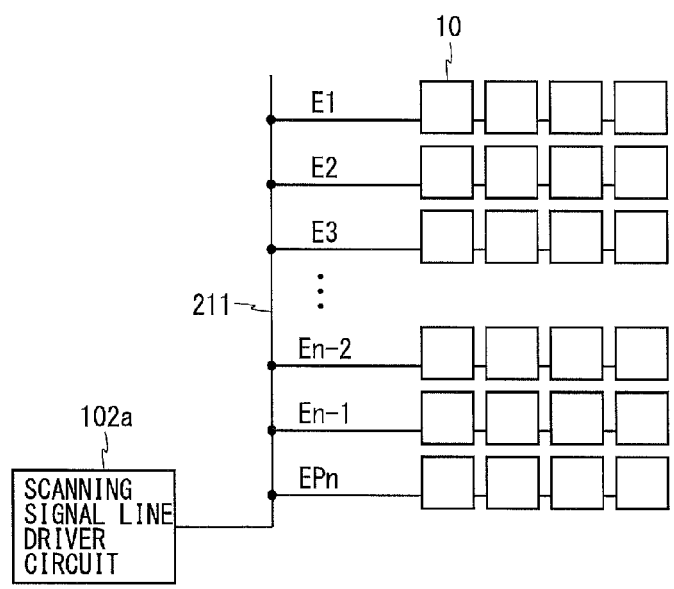
FIG. 7 is a diagram illustrating another example of the connecting arrangement of control lines in the embodiment.

FIG. 7 is a diagram illustrating the connecting arrangement of control lines $E_i$ in the above configuration. The display device shown in FIG. 7 is provided with a common control line 211 for connecting a scanning signal line driver circuit 102a and the control lines $E_i$. The common control line 211 is connected at one end to a control signal output terminal of the scanning signal line driver circuit 102a, and all of the control lines $E_i$ are connected to the common control line 211. Note that the common control line 211 does not have to be a bus line so long as all of the control lines $E_i$ can be commonly connected to the scanning signal line driver circuit 102a, and the number of common control lines and their connecting points with the control lines $E_i$ can be determined in accordance with any well-known configuration, e.g., in the case where the control lines $E_i$ are divided into groups, all control lines $E_i$ included in one group are commonly connected to a common control line (i.e., the number of common control lines provided is the same as the number of groups). This results in a simplified configuration because the scanning signal line driver circuit 102a requires only one control signal output terminal, and further, the area of wiring up to the control lines $E_i$ can be reduced.

As described above, the power control circuit 4 included in the display device 100 according to the present embodiment applies an initialization potential to the common power line 9, and therefore the initialization potential can be readily provided through the power lines $VP_i$ to the pixel circuits 10. As a result, the need for any additional feature for providing the initialization potential is eliminated, so that the number of elements in the pixel circuits 10 can be reduced. Moreover, the power control circuit 4 drives one common power line 9 electrically connected to all of the power lines $VP_i$. Accordingly, when compared to the case where the power lines $VP_i$ are driven individually, the number of output buffers provided in the power control circuit 4 can be significantly reduced, resulting in a reduced circuit scale of the power control circuit 4. Moreover, the number of times at which to drive the power source can be set to be once per frame, and therefore, power consumption can be reduced compared to the case where, for example, the power source is driven the number of times corresponding to the number of rows. In addition, since the number of common power lines 9 is one (or relatively low), the area of wiring for power supply can be reduced.

Figure 8:
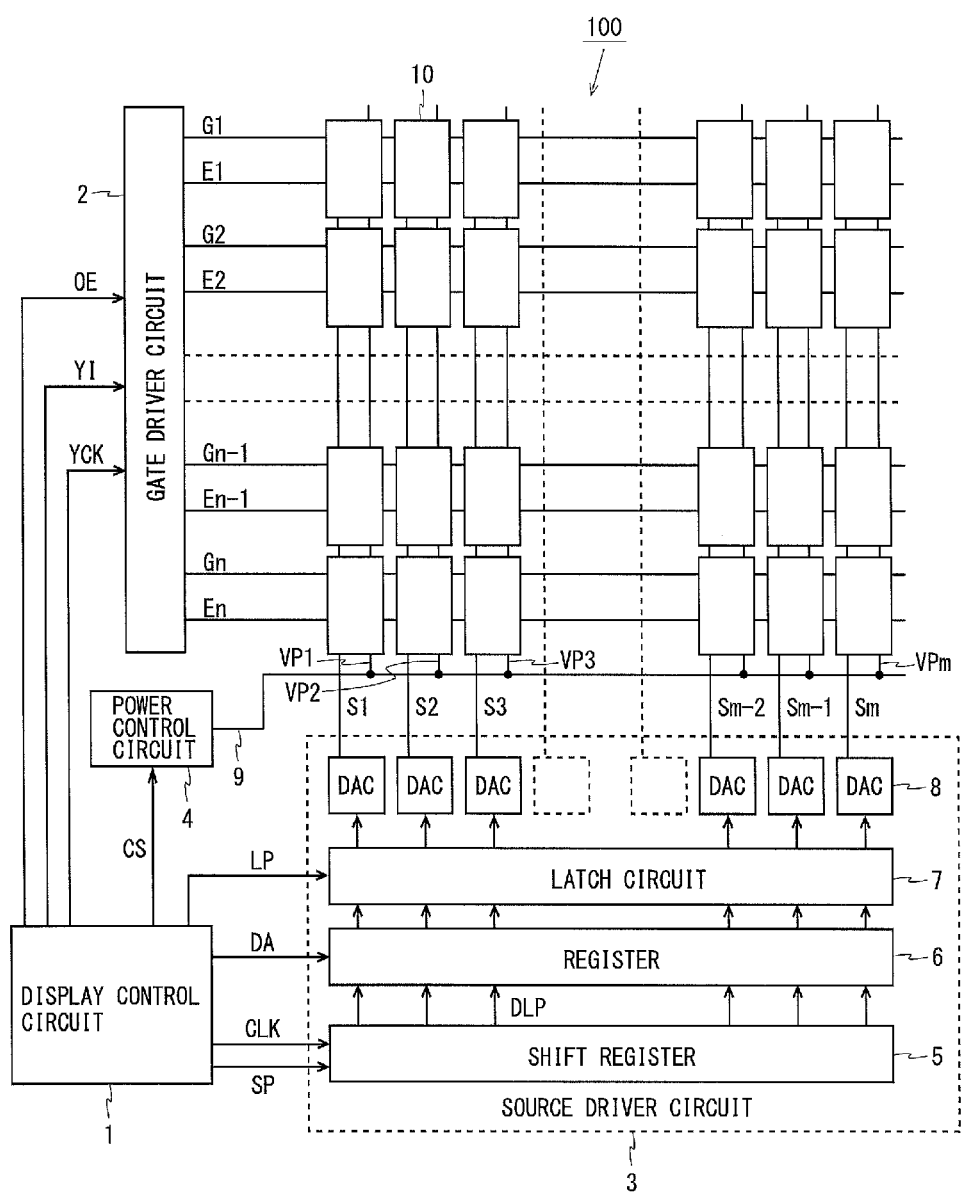
FIG. 8 is a block diagram illustrating another exemplary configuration of the display device according to the embodiment.

Note that in the case where one common power line 9 is electrically connected to all power lines $VP_i$, the arrangement and connecting fashion of the common power line 9 and the power lines $VP_i$ can be determined in accordance with any well-known configuration, and for example, a configuration as shown in FIG. 8 can be employed.

FIG. 8 is a block diagram illustrating another exemplary configuration of the display device according to the present embodiment. Unlike in the configuration shown in FIG. 1, m power lines $VP_i$ provided in the display device 100 shown in FIG. 8 are provided parallel to m data lines $S_j$ rather than to n control lines $E_i$ and n scanning signal lines $G_i$. By arranging the power lines $VP_i$ in this manner, the number of pixel circuits 10 to be connected per power line $VP_i$ can be reduced, and the difference in the amount of current to be provided among the pixel circuits 10 can be reduced. However, to ensure a significantly large electrode width, the configuration shown in FIG. 1 is more preferable.

Furthermore, in the present embodiment, the gate driver circuit 2 selects and controls all of the initialized pixel circuits 10 to perform threshold detection on the TFTs 12. Moreover, the gate driver circuit 2 selects and controls the initialized pixel circuits 10 row by row to sequentially perform writing to the TFTs 12 and emit light. As a result, a screen can be displayed with the threshold voltage of the TFTs 12 being compensated for.

Furthermore, upon initialization, the TFT 13 is controlled and brought into ON state, and when an initialization potential is applied to the power line $VP_i$ for initialization, the gate voltage of the TFT 12 is set to the reference potential Vref, so that the TFT 12 is brought into ON state, and the initialization potential can be applied to the source terminal of the TFT 12. Moreover, upon light emission, the TFT 13 is controlled and brought into ON state for a prescribed period of time. As a result, the emission period length is equalized among the pixel circuits 10, thereby inhibiting variations in luminance. Moreover, since the pixel circuits 10 are unlit except in the emission period, moving picture performance can be enhanced as in the case where black insertion is carried out.

Furthermore, all transistors included in the pixel circuits 10 are of n-channel type. In this manner, since the transistors included in the pixel circuits 10 are of the same conductive type, cost of the display device can be reduced.

Second Embodiment

The configuration and operation of a display device according to a second embodiment of the present invention are approximately the same as those of the display device according to the first embodiment shown in FIG. 1, except for the connecting arrangement of the power lines and the operation of the pixel circuits, therefore, the same components are denoted by the same reference characters, and any descriptions thereof will be omitted. Hereinafter, features and operations characteristic of the second embodiment will be described.

Figure 9:
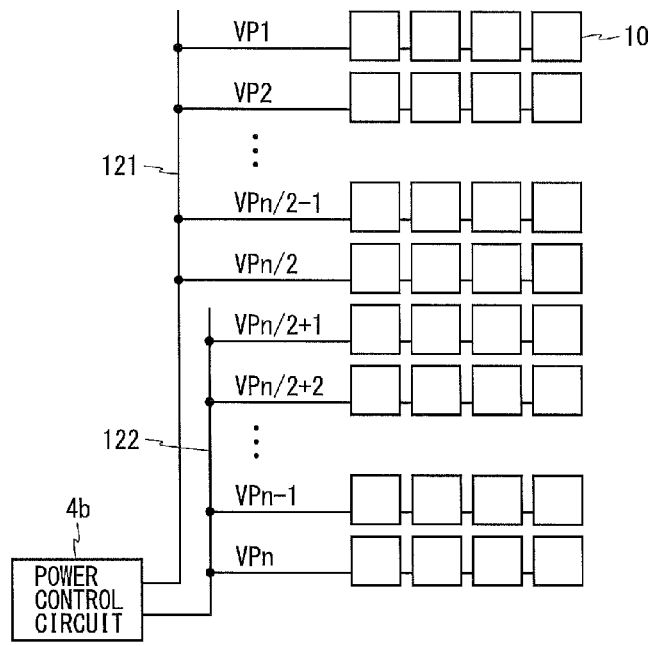
FIG. 9 is a diagram illustrating the connecting arrangement of power lines in a display device according to a second embodiment of the present invention.

FIG. 9 is a diagram illustrating the connecting arrangement of power lines $VP_i$ in the display device according to the second embodiment of the present invention. The display device is provided with two common power lines 121 and 122 for connecting a power control circuit 4b to the power lines $VP_i$. The common power lines 121 and 122 are connected at one end to two output terminals, respectively, of the power control circuit 4b. Power lines $VP_1$ to $VP_{n/2}$ are connected to the common power line 121, and power lines $VP_{(n/2+1)}$ to $VP_n$ are connected to the common power line 122.

Figure 10:
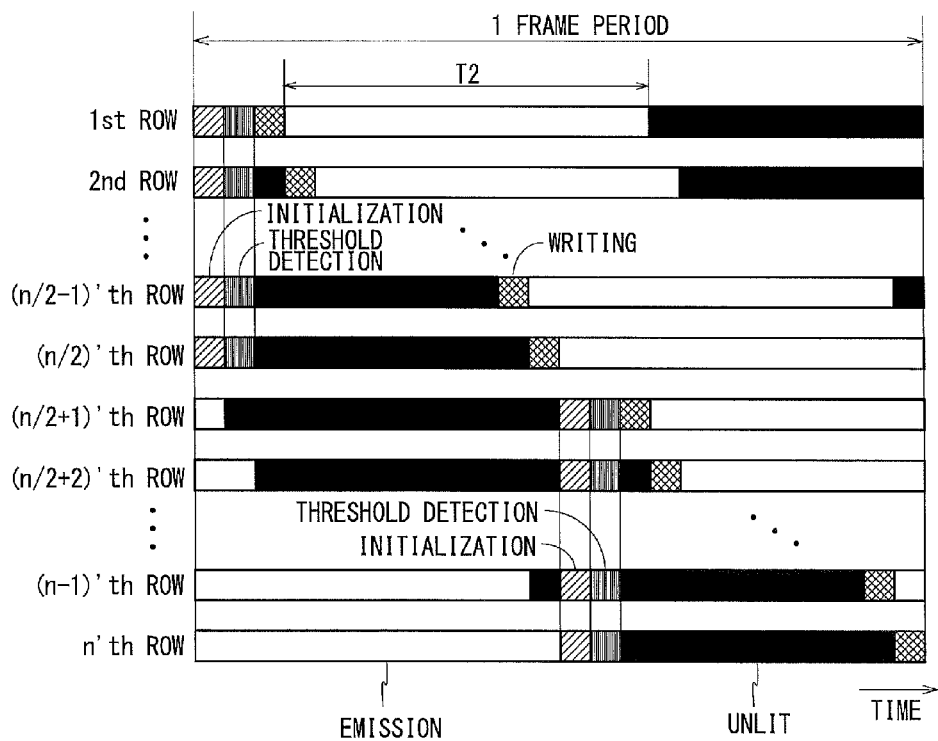
FIG. 10 is a diagram showing the operation of rows of pixel circuits in the embodiment.

FIG. 10 is a diagram showing the operation of rows of pixel circuits 10 in the display device according to the second embodiment of the present invention. The power control circuit 4b applies a low-level potential to the common power line 121 for a predetermined period of time at the beginning of a frame period, and after half a frame period, the power control circuit 4b applies a low-level potential to the common power line 122 for a predetermined period of time. Accordingly, the pixel circuits in the first through (n/2)'th rows are initialized at the beginning of the frame period, and the pixel circuits in the (n/2+1)'th through n'th rows are initialized with a delay of half a frame period. Immediately after the first initialization, all of the pixel circuits in the first through (n/2)'th rows are selected simultaneously for a predetermined period of time, and immediately after the second initialization, all of the pixel circuits in the (n/2+1)'th to n'th rows are selected simultaneously for a predetermined period of time, and the selected pixel circuits perform threshold detection. After the first threshold detection, the pixel circuits in the first through (n/2)'th rows are sequentially selected row by row, and after the second threshold detection, the pixel circuits in the (n/2+1)'th to n'th rows are sequentially selected row by row. The selected pixel circuits perform writing. The pixel circuits in each row are lit up for a predetermined period of time T2 after the writing, and they are unlit in other periods.

As in the first embodiment, the pixel circuits in each row in the display device need to be lit up for the same period of time, but unlike in the first embodiment where initialization always takes place at the beginning of a frame, the pixel circuits in the n'th row do not need to finish emitting light by the end of the frame period. Therefore, in the example shown in FIG. 10, the scanning speed of the pixel circuits is the same as normal, and the emission period length T2 of the pixel circuits is about half a frame period.

As described above, in the display device of the present embodiment, unlike in the first embodiment, the scanning speed of the pixel circuit can be set to be the same as normal, and therefore a sufficient amount of time can be ensured for writing as in the normal case. Note that the emission period length may be set to be shorter than half a frame period while setting the scanning speed of the pixel circuits to be the same as normal. Alternatively, the emission period length may be set to be longer than half a frame period while setting the scanning speed of the pixel circuit to be faster than normal.

Furthermore, in the display device of the present embodiment, since the number of output buffers provided in the power control circuit 4 is increased to two, compared to the first embodiment, the circuit scale of the power control circuit 4 is larger than in the first embodiment, so that the number of output buffers provided in the power control circuit 4 can be less than the number of power lines $VP_i$, and therefore, it can be said that the circuit scale of the power control circuit 4 can be reduced. In addition, the configuration of the present embodiment makes it possible to achieve effects similar to those achieved in the first embodiment, and further, an initialization potential is applied to the common power lines 121 and 122 at different times from each other, whereby the pixel circuits 10 can be initialized at suitable times in accordance with selection periods of the pixel circuits 10. Moreover, a plurality of adjacently disposed power lines $VP_i$ are connected to the common power lines 121 and 122, so that writing to the pixel circuits 10 can be performed in accordance with sequential order within the display screen.

Third Embodiment

The configuration and operation of a display device according to a third embodiment of the present invention are approximately the same as those of the display device according to the first embodiment shown in FIG. 1, except for the connecting arrangement of the power lines and the operation of the pixel circuits, therefore, the same components are denoted by the same reference characters, and any descriptions thereof will be omitted. Hereinafter, features and operations characteristic of the third embodiment will be described.

Figure 11:
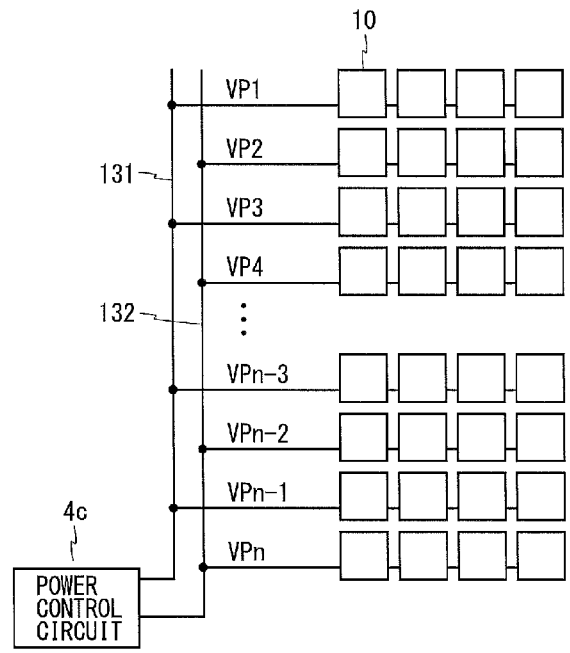
FIG. 11 is a diagram illustrating the connecting arrangement of power lines in a display device according to a third embodiment of the present invention.

FIG. 11 is a diagram illustrating the connecting arrangement of power lines $VP_i$ in the display device according to the third embodiment of the present invention. The display device is provided with two common power lines 131 and 132 for connecting a power control circuit 4c to the power lines $VP_i$. The common power lines 131 and 132 are connected at one end to two output terminals, respectively, of the power control circuit 4c. Power lines $VP_1$, $VP_3$, and so on, in odd rows are connected to the common power line 131, and power lines $VP_2$, $VP_4$, and so on, in even rows are connected to the common power line 132.

Figure 12:
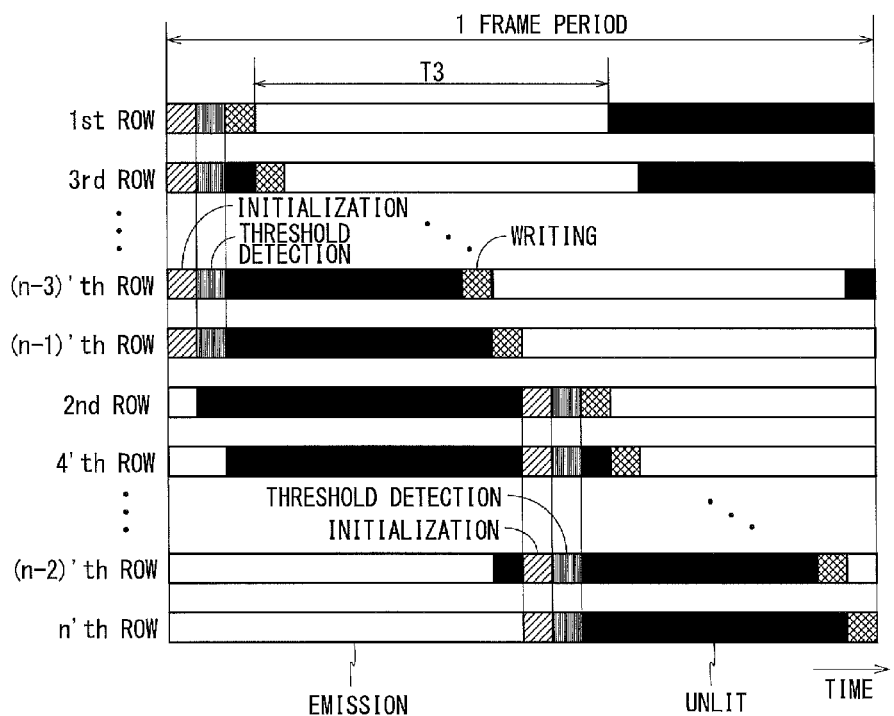
FIG. 12 is a diagram showing the operation of rows of pixel circuits in the embodiment.

FIG. 12 is a diagram showing the operation of rows of pixel circuits 10 in the display device according to the third embodiment. The power control circuit 4c applies a low-level potential to the common power line 131 for a predetermined period of time at the beginning of a frame period, and after half a frame period, the power control circuit 4c applies a low-level potential to the common power line 132 for a predetermined period of time. Accordingly, the pixel circuits in odd rows are initialized at the beginning of the frame period, and the pixel circuits in even rows are initialized with a delay of half a frame period. All of the pixel circuits in odd rows are selected simultaneously for a predetermined period of time immediately after the first initialization, all of the pixel circuits in even rows are selected simultaneously for a predetermined period of time immediately after the second initialization, and the selected pixel circuits perform threshold detection. After the first threshold detection, the pixel circuits in odd rows are sequentially selected row by row, and after the second threshold detection, the pixel circuits in even rows are sequentially selected row by row. The selected pixel circuits perform writing. The pixel circuits in each row are lit up for a predetermined period of time T3 after the writing, and they are unlit in other periods. In the example shown in FIG. 12, the scanning speed of the pixel circuits is the same as normal, and the emission period length T3 of the pixel circuits is about half a frame period.

As described above, in the display device of the present embodiment, as in the second embodiment, it can be said that the circuit scale of the power control circuit 4 can be reduced. In addition, the configuration of the present embodiment makes it possible to achieve effects similar to those achieved in the first embodiment, and further, writing to the pixel circuits 10 can be performed in accordance with sequential order within the display screen. However, in the case where there is a significant difference in the amount of current flow between the common power lines 121 and 122, e.g., when the luminance of a screen greatly varies between the upper and lower halves of the screen, there might be a difference in luminance at the center of the screen. In the display device according to the present embodiment, unlike in the second embodiment, the amount of current flow in most cases is approximately equal between the common power lines 131 and 132, so that such a difference in luminance that might occur at the screen center can be prevented.

Fourth Embodiment

The configuration and operation of a display device according to a fourth embodiment of the present invention are approximately the same as those of the display device according to the first embodiment shown in FIG. 1, except for the connecting arrangement of the power lines and the operation of the pixel circuits, therefore, the same components are denoted by the same reference characters, and any descriptions thereof will be omitted. Hereinafter, features and operations characteristic of the fourth embodiment will be described.

Figure 13:
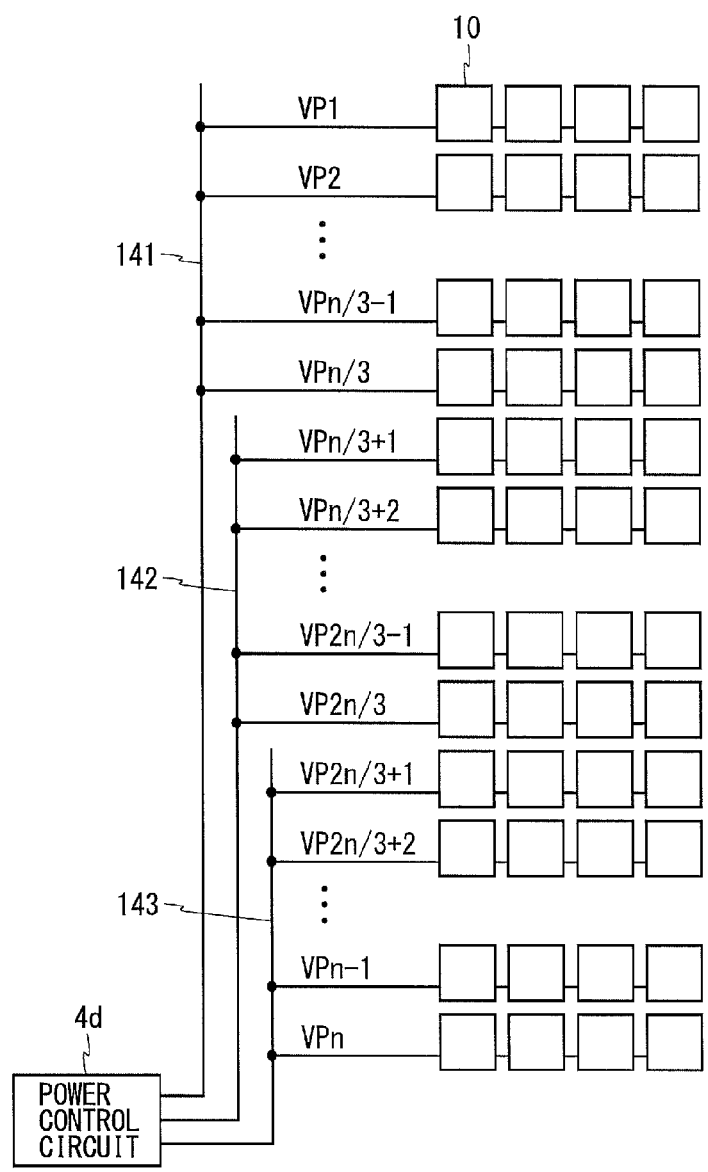
FIG. 13 is a block diagram illustrating the configuration of a display device according to a fourth embodiment of the present invention.

FIG. 13 is a diagram illustrating the connecting arrangement of power lines $VP_i$ in the display device according to the fourth embodiment of the present invention. The display device is provided with three common power lines 141 to 143 for connecting a power control circuit 4d to the power lines $VP_i$. The common power lines 141 to 143 are connected at one end to three output terminals, respectively, of the power control circuit 4d. Power lines $VP_1$ to $VP_{n/3}$ are connected to the common power line 141, power lines $VP_{(n/3+1)}$ to $VP_{(2n/3)}$ to the common power line 142, and power lines $VP_{(2n/3+1)}$ to $VP_n$ to the common power line 143.

Figure 14:
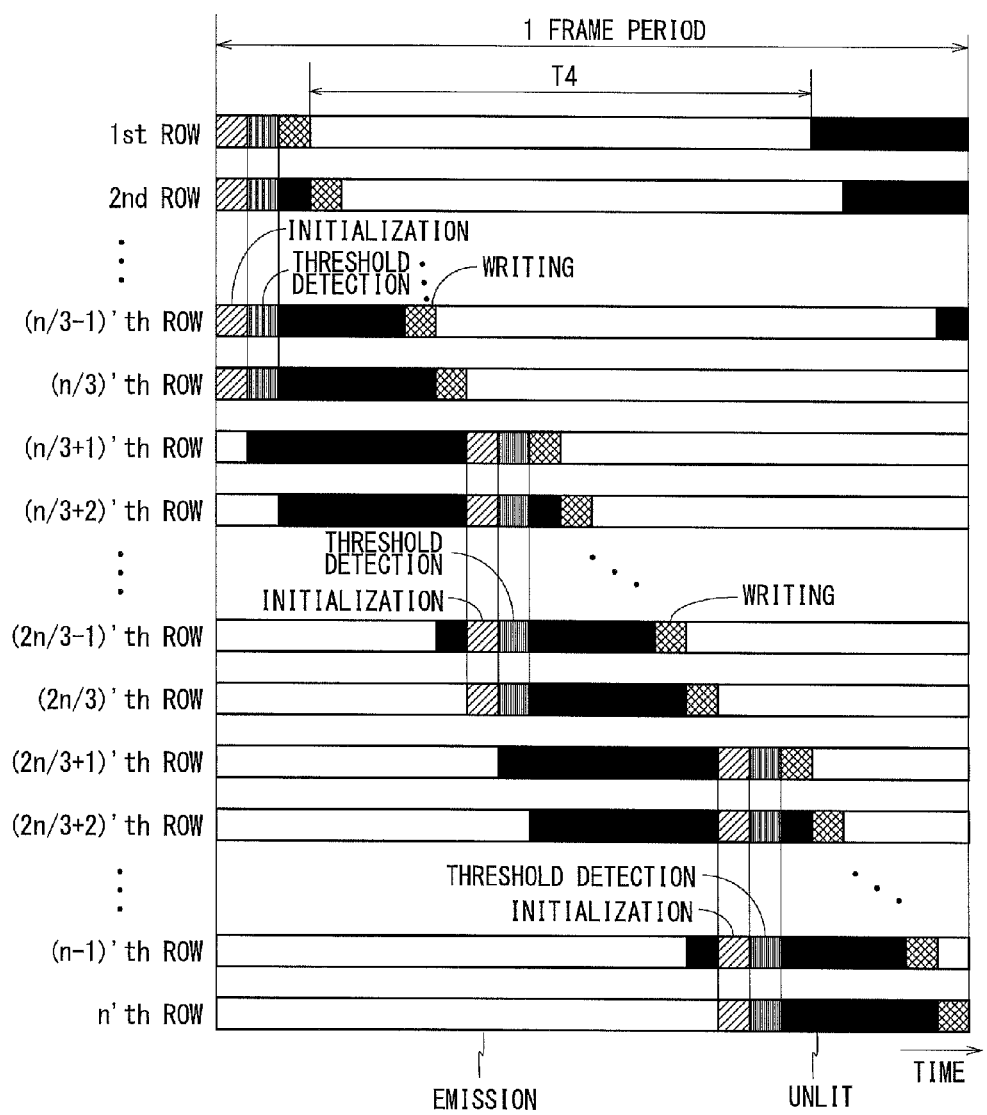
FIG. 14 is a diagram showing the operation of rows of pixel circuits in the embodiment.

FIG. 14 is a diagram showing the operation of rows of pixel circuits 10 in the display device according to the fourth embodiment. The power control circuit 4d applies a low-level potential to the common power line 141 for a predetermined period of time at the beginning of a frame period, to the common power line 142 for a predetermined period of time after a third of the frame period, and to the common power line 143 for a predetermined period of time after another third of the frame period. Accordingly, the pixel circuits in the first through (n/3)'th rows are initialized at the beginning of the frame period, the pixel circuits in the (n/3+1)'th to (2n/3)'th rows are initialized with a delay of a third of the frame period, and the pixel circuits in the (2n/3+1)'th to n'th rows are initialized with a delay of another third of the frame period.

Immediately after the first initialization, all of the pixel circuits in the first through (n/3)'th rows are selected simultaneously, immediately after the second initialization, all of the pixel circuits in the (n/3+1)'th to (2n/3)'th rows are selected simultaneously, and immediately after the third initialization, all of the pixel circuits in the (2n/3+1)'th to n'th rows are selected simultaneously. The selected pixel circuits perform threshold detection.

After the first threshold detection, the pixel circuits in the first through (n/3)'th rows are sequentially selected, after the second threshold detection, the pixel circuits in the (n/3+1)'th to (2n/3)'th rows are sequentially selected, and after the third threshold detection, the pixel circuits in the (2n/3+1)'th to n'th rows are sequentially selected. The selected pixel circuits perform writing. The pixel circuits in each row are lit up for a predetermined period of time T4 after the writing, and they are unlit in other periods. In the example shown in FIG. 14, the scanning speed of the pixel circuits is the same as normal, and the emission period length T4 of the pixel circuits is about two thirds of a frame period.

Note that the number p of common power lines 9 may be four or more. Even when the number p is four or more, the connecting arrangement of the power lines $VP_i$ and the operation of rows of pixel circuits 10 are the same as described above. Moreover, when the number p is three or more, (n/p) adjacently disposed power lines may be connected to the same common power line, or every (p−1)'th power line, in total (n/p) lines, may be connected to the same common power line. For example, where p=3, every third power line $VP_i$ may be selected, such that power lines $VP_1$, $VP_4$, and so on, are connected to the first common power line, power lines $VP_2$, $VP_5$, and so on, to the second common power line, and power lines $VP_3$, $VP_6$, and so on, to the third common power line. Moreover, where p=1, m power lines may be provided so as to correspond to columns of pixel circuits 10 as shown in FIG. 8, rather than n power lines $VP_i$ being provided so as to correspond to rows of pixel circuits 10. In addition, where p=n, the common power line 9 is substantially the same as the power line $VP_i$.

In this manner, there are tradeoffs among the number p of common power lines 9, the scanning speed of the pixel circuits 10, and the emission period length of the pixel circuits 10. For example, by increasing the number p of common power lines 9, it is rendered possible to lower the scanning speed of the pixel circuits 10 and extend the emission period of the pixel circuits 10. However, in such a case, the number of output buffers provided in the power control circuit 4 increases, resulting in an increased circuit scale of the power control circuit 4. Accordingly, these parameters need to be determined considering the specifications and cost of the display device.

As described above, in the display device of the present embodiment, as in the second embodiment, the circuit scale of the power control circuit 4 can be reduced, and further, similar effects to those achieved in the second embodiment can be achieved.

Furthermore, as described in conjunction with the first through fourth embodiments, the display device 100 includes a plurality of pixel circuits 10 arranged in a matrix, a plurality of scanning signal lines $G_i$ and control lines $E_i$ provided so as to correspond to rows of pixel circuits 10, a plurality of data lines $S_j$ provided so as to corresponding to columns of pixel circuits 10, a plurality of power lines $VP_i$ provided to supply a power potential to the pixel circuits 10, p (p≥1) common power lines 9 connected to two or more power lines $VP_i$, a gate driver circuit 2 for driving the scanning signal lines $G_i$ and the control lines $E_i$, a source driver circuit 3 for driving the data lines S and a power control circuit 4 for driving the power lines $VP_i$. Each pixel circuit 10 includes an organic EL element 16 (electro-optic element), a TFT 12 (drive transistor) provided in a path of current flowing through the organic EL element 16, a TFT 11 (write control transistor) provided between a gate terminal of the TFT 12 and the data line $S_j$, a TFT 13 (emission control transistor) provided between a drain terminal of the TFT 12 and the power line $VP_i$, and a capacitor 15 provided between a source terminal of the TFT 12 and the gate terminal. The power control circuit 4 applies a power potential and an initialization potential to the p common power lines 9 while switching therebetween. This configuration achieves the aforementioned effects.

Fifth Embodiment

The configuration and operation of a display device according to a fifth embodiment of the present invention are approximately the same as those of the display device according to the first embodiment shown in FIG. 1, except for an initialization operation in accordance with a potential change of a video signal line, therefore, the same components are denoted by the same reference characters, and any descriptions thereof will be omitted. Hereinafter, features and operations characteristic of the fifth embodiment will be described.

Figure 15:
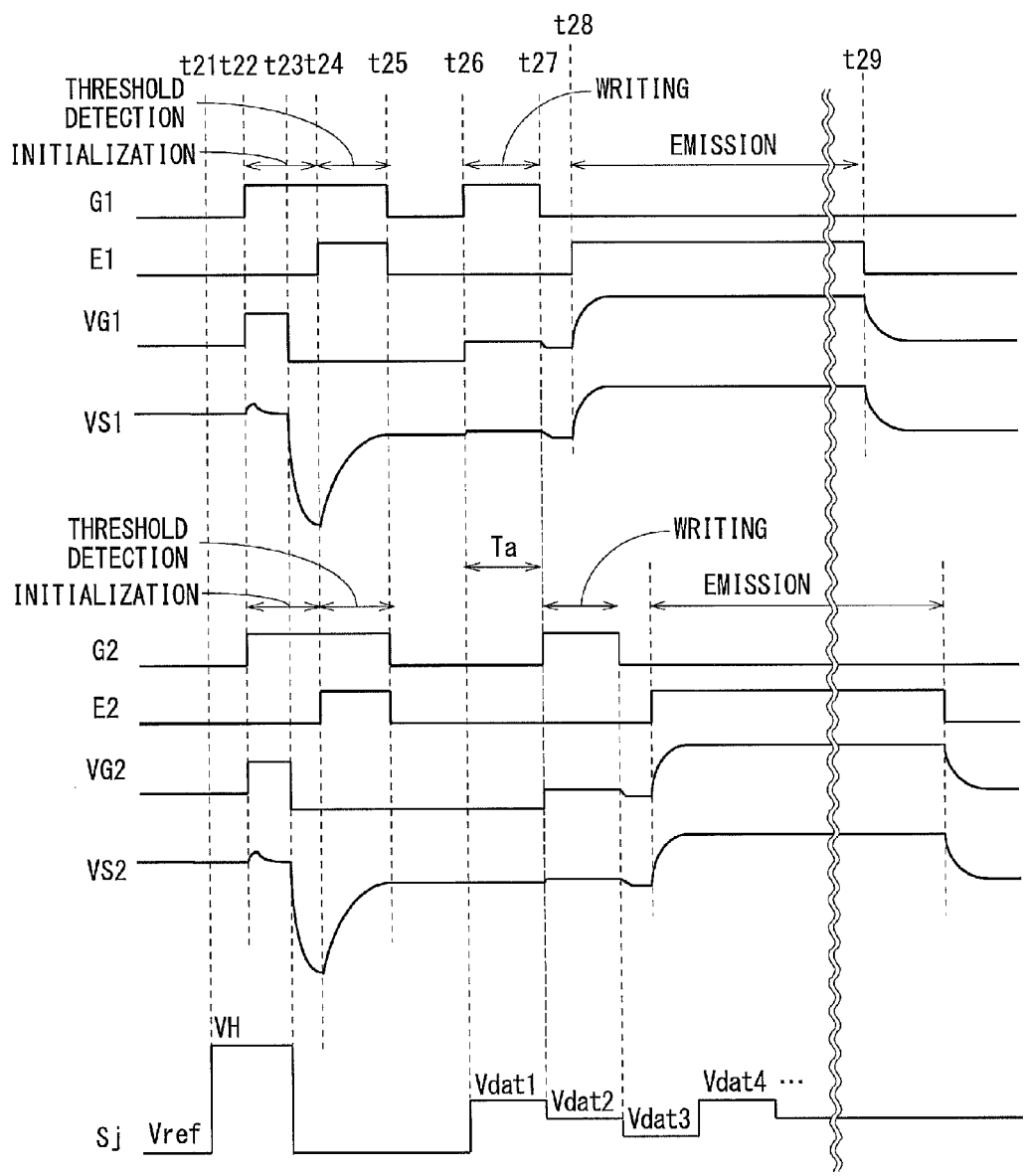
FIG. 15 is a diagram showing a timing chart describing a method for driving a pixel circuit in a display device according to a fifth embodiment of the present invention.

FIG. 15 is a diagram showing a timing chart describing a method for driving a pixel circuit 20 in the present embodiment. The operation of a pixel circuit in the first row will be described below with reference to FIG. 15. Note that characters shown in FIG. 15 denote the same as in FIG. 3.

The operation of the pixel circuit in the first row will now be described with reference to FIG. 15. In the present embodiment, the potential of power line $VP_1$ is kept at a constant power potential level without changing therefrom. Accordingly, the potential is not shown in FIG. 15. Prior to time $t_{21}$, the potentials of scanning signal line $G_1$ and control line $E_1$ are low level. Accordingly, the pixel circuit 10 is unlit, and source potential $VS_1$ of the TFT 12 is kept low at the same level as a cutoff voltage Vth_EL for the organic EL element 16 since no current is applied through power line $VP_1$.

At time $t_{21}$, a predetermined initialization voltage VH is applied to the data line $S_j$. The initialization voltage VH is a predetermined high-level signal voltage for reset, which changes the level of potential, as will be described later.

At time $t_{22}$, the potential of scanning signal line $G_1$ is set to high level, turning the TFT 11 on, so that the initialization voltage VH is written to the TFT 12 as gate potential $VG_1$. At this time, source potential $VS_1$ of the TFT 12 capacitively coupled by the capacitor 15 temporarily rises, but immediately after discharge occurs via the organic EL element 16, source potential $VS_4$ of the TFT 12 falls to the level of the cutoff voltage Vth_EL.

At time $t_{23}$, the potential of the data line $S_j$ falls from the initialization voltage VH to the reference potential Vref with the TFT 11 on. Such a change in potential lowers the source potential of the TFT 12 capacitively coupled via the capacitor 15. Specifically, the gate-source voltage Vgs of the TFT 12 at and after time $t_{23}$ can be obtained by the following equation (5).

$$Vgs = Vth\_EL - C_{st}/(C_{OLED}+C_{st}) \times (VH-Vref) \qquad (5)$$

Note that in equation (5), $C_{OLED}$ is a capacitance value of the organic EL element 16, and $C_{st}$ is a capacitance value of the capacitor 15.

Subsequently, from time $t_{24}$ onward, threshold detection, writing, and light-emission operations are performed as in the first through fourth embodiments, and therefore, any descriptions of these subsequent operations will be omitted.

As described above, in the display device of the present embodiment, unlike in the first through fourth embodiments, an output buffer provided in the power control circuit 4 simply outputs a constant power potential and is not driven at all. Accordingly, the need for the capability to perform drive for a potential change is eliminated, resulting in a reduced circuit scale of the power control circuit 4. In addition, the configuration of the present embodiment makes it possible to achieve similar effects to those achieved in the first embodiment.

(Primary Variants)

In the second embodiment, as in the first embodiment, the emission period starts not long after data writing, but the emission period may be determined so as to start simultaneously in the first through (n/2)'th rows and also in the (n/2+1)'th to n'th rows, as described in the first embodiment as an extra example in conjunction with FIG. 6.

Figure 16:
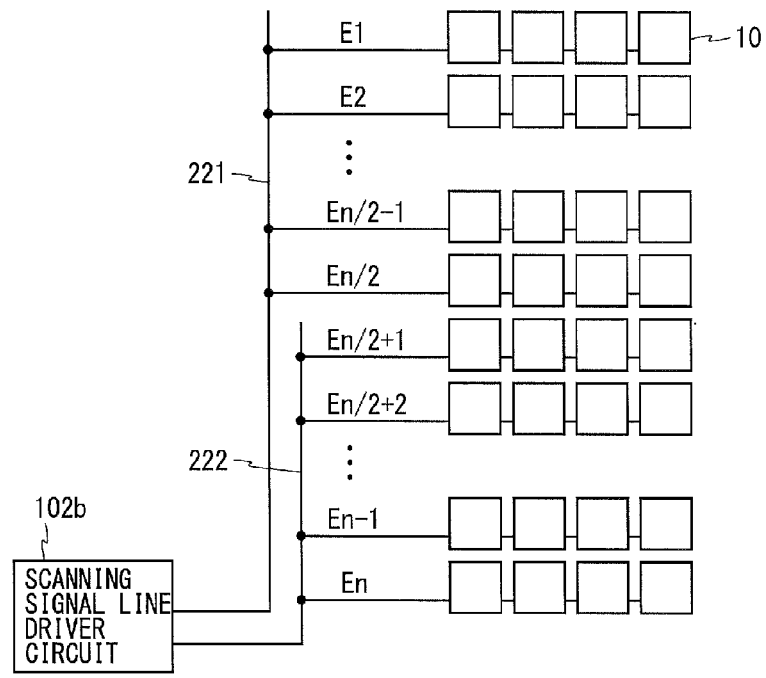
FIG. 16 is a diagram showing the connecting arrangement of control lines $E_i$ in a variant of the second embodiment.

FIG. 16 is a diagram showing the connecting arrangement of control lines $E_i$ in a variant configuration as mentioned above. The display device shown in FIG. 16 is provided with two common control lines 221 and 222 for connecting a scanning signal line driver circuit 102b to the control lines $E_i$. The common control lines 221 and 222 are connected at one end to two output terminals, respectively, of the scanning signal line driver circuit 102b. Control lines $E_1$ to $E_{n/2}$ are connected to the common control line 221, and control lines $E_{(n/2+1)}$ to $E_n$ are connected to the common control line 222.

Figure 17:
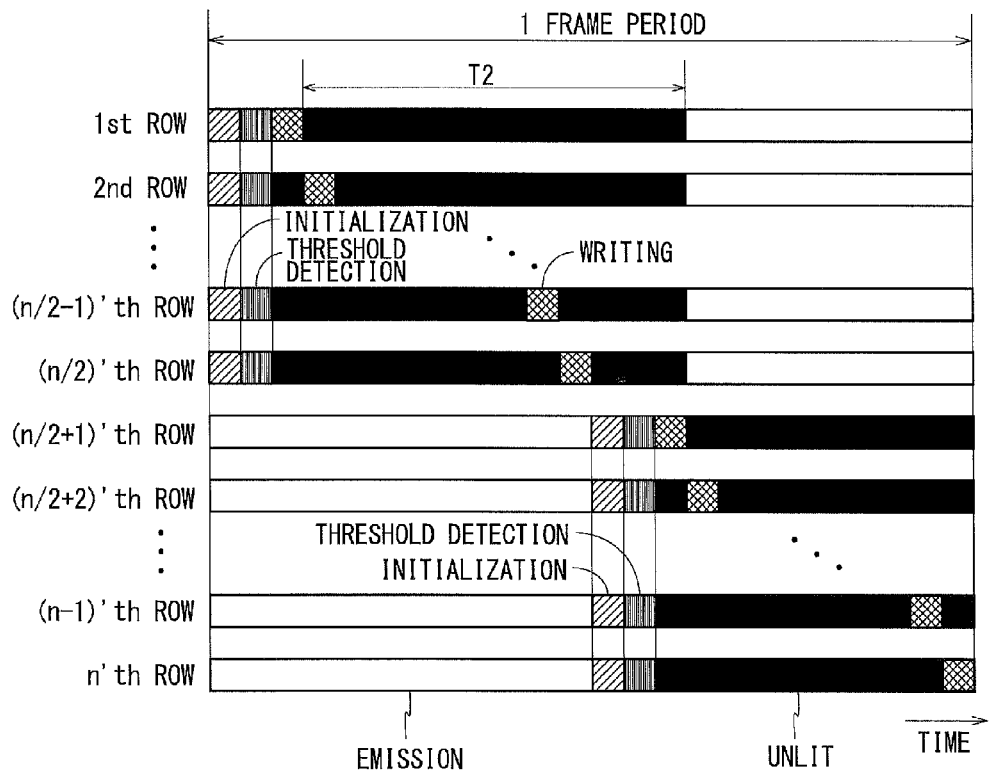
FIG. 17 is a diagram showing the operation of rows of pixel circuits 10 in a display device according to the variant of the second embodiment.

FIG. 17 is a diagram showing the operation of rows of pixel circuits 10 in the display device according to the variant of the second embodiment. As can be appreciated in comparison of the example shown in FIG. 17 with the example shown in FIG. 10, the initialization, threshold detection, and selection operations for the rows are performed in the same manner, but unlike in the example shown in FIG. 6, the emission period does not start simultaneously in all of the rows, however it starts simultaneously in the first through (n/2)'th rows, and then in the (n/2+1)'th to n'th rows.

In this manner, in the variant, unlike in the first embodiment, but as in the second embodiment, the scanning speed of the pixel circuits can be set to be the same as normal, and therefore a sufficient amount of time can be ensured for writing as in the normal case. Moreover, leakage current from the TFT 12 can be approximately equalized among the pixel circuits 10 in the first through (n/2)'th rows and among the pixel circuits 10 in the (n/2+1)'th to n'th rows, and therefore the amount of decrease in luminance due to leakage current can be approximately equalized among the pixel circuits 10 in the first through (n/2)'th rows and among the pixel circuits 10 in the (n/2+1)'th to n'th rows, thereby inhibiting uneven display. In addition, since the scanning signal line driver circuit 102b uses only two control signal output terminals, a simplified configuration can be achieved, and further, since there are required only two common control lines, the area of wiring up to the control lines $E_i$ can be reduced.

Furthermore, in the third embodiment also, as in the first embodiment, the emission period starts not long after data writing, but the emission period may be defined so as to start simultaneously in even rows and also in odd rows.

Figure 18:
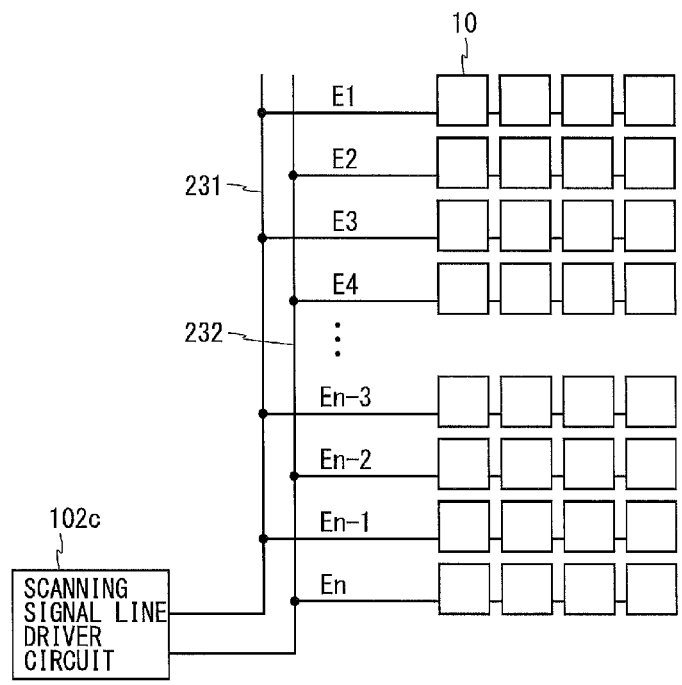
FIG. 18 is a diagram showing the connecting arrangement of control lines $E_i$ in a variant of the third embodiment.

FIG. 18 is a diagram showing the connecting arrangement of control lines $E_i$ in a variant configuration as mentioned above. The display device shown in FIG. 18 is provided with two common control lines 231 and 232 for connecting a scanning signal line driver circuit 102*c* to the control lines $E_i$. The common control lines 231 and 232 are connected at one end to two output terminals, respectively, of the scanning signal line driver circuit 102*c*. Control lines $E_1$, $E_3$, and so on, in odd rows are connected to the common control line 231, and control lines $E_2$, $E_4$, and so on, in even rows are connected to the common control line 232.

Figure 19:
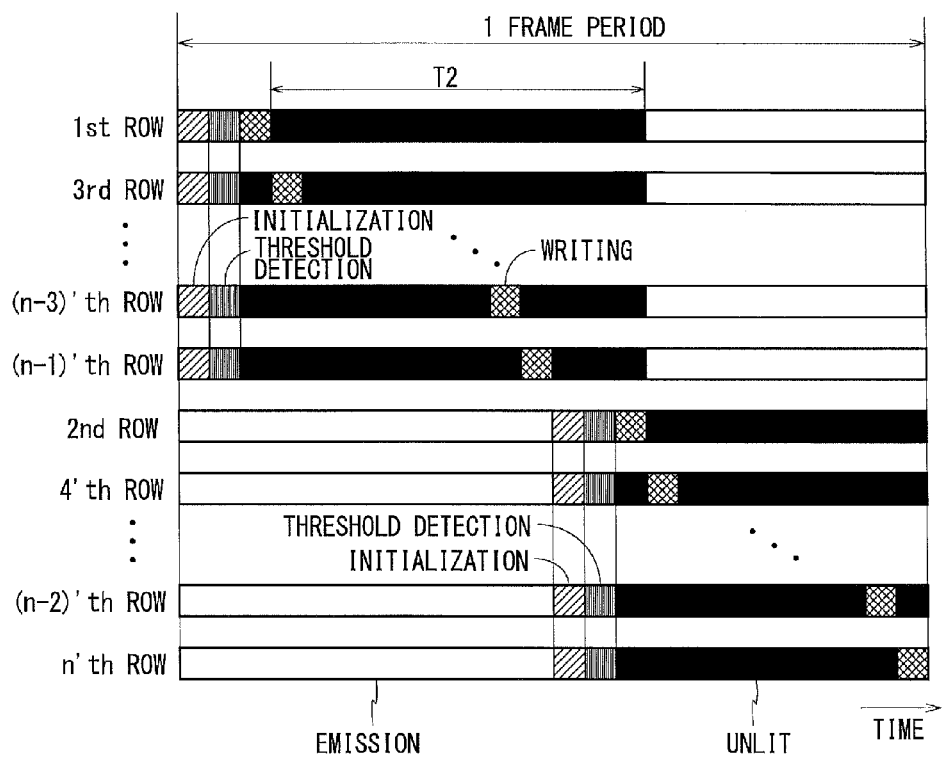
FIG. 19 is a diagram showing the operation of rows of pixel circuits 10 in a display device according to the variant of the third embodiment.

FIG. 19 is a diagram showing the operation of rows of pixel circuits 10 in the display device according to the variant of the third embodiment. As can be appreciated in comparison of the example shown in FIG. 19 with the example shown in FIG. 12, the initialization, threshold detection, and selection operations for the rows are performed in the same manner, but unlike in the example shown in FIG. 6, the emission period does not start simultaneously in all of the rows, however it starts simultaneously in even rows, and also in odd rows.

In this manner, in the present variant also, the scanning speed of the pixel circuits can be set to be the same as normal, and therefore a sufficient amount of time can be ensured for writing as in the normal case. Moreover, leakage current from the TFT 12 can be approximately equalized among the pixel circuits 10 in even rows and among the pixel circuits 10 in odd rows, and therefore the amount of decrease in luminance due to leakage current can be approximately equalized among them, thereby inhibiting uneven display. In addition, since the scanning signal line driver circuit 102*c* uses only two control signal output terminals, a simplified configuration can be achieved, and further, since there are required only two common control lines, the area of wiring up to the control lines $E_i$ can be reduced.

Note that similarly in the fourth embodiment shown in FIGS. 13 and 14, the emission period can be controlled so as to start simultaneously in a manner as described above, although any detailed description thereof will be omitted herein, and therefore, this similar configuration makes it possible to achieve similar effects to those described above.

(Other Variants)

In the first through fourth embodiments, normally, the capacitance value of the organic EL element 16 is considerably higher than that of the capacitor 15, but there can be conceived a configuration example where such a difference in capacitance value would not be extremely large. In such a case, the aforementioned transformation from equation (1) to equation (2) cannot be performed in a manner as described earlier (at least not with high accuracy), and therefore, it cannot be said that the gate-source voltage Vgs of the TFT 12 is approximately equal to (Vdat1−Vref+Vth). Therefore, a configuration with an inserted auxiliary capacitor 25 as shown in FIG. 20 can be conceived.

Figure 20:
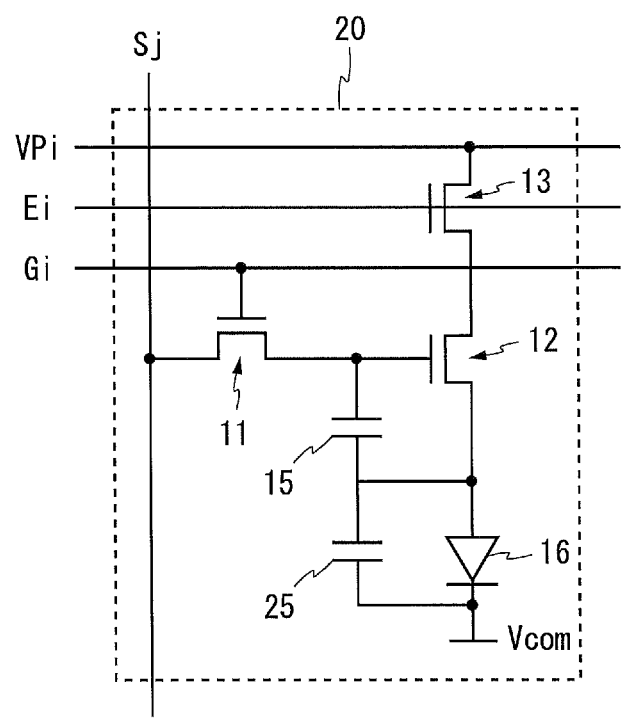
FIG. 20 is a circuit diagram of a pixel circuit in a variant on the first through fourth embodiments.
Figure 21:
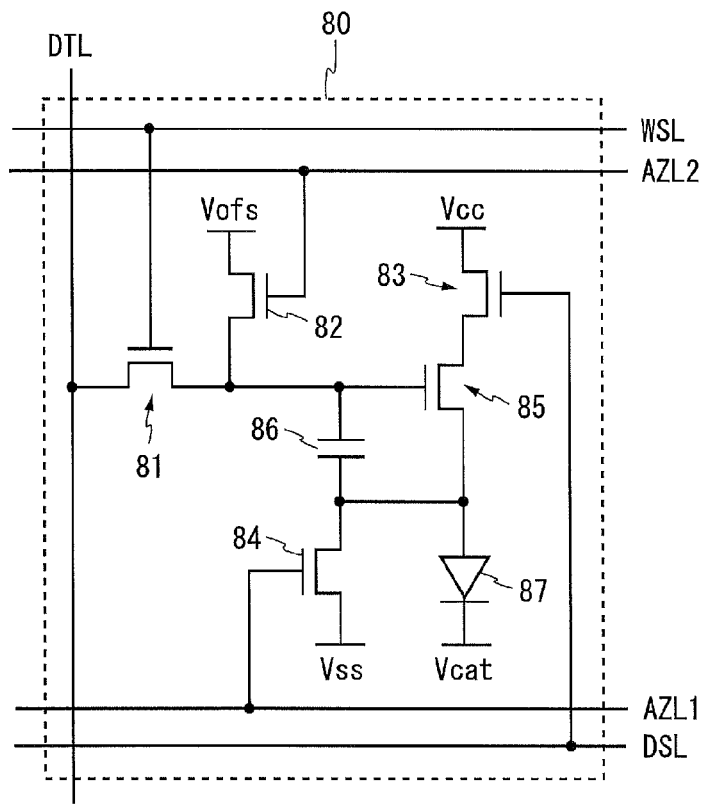
FIG. 21 is a circuit diagram of a pixel circuit included in a conventional display device.
Figure 22:
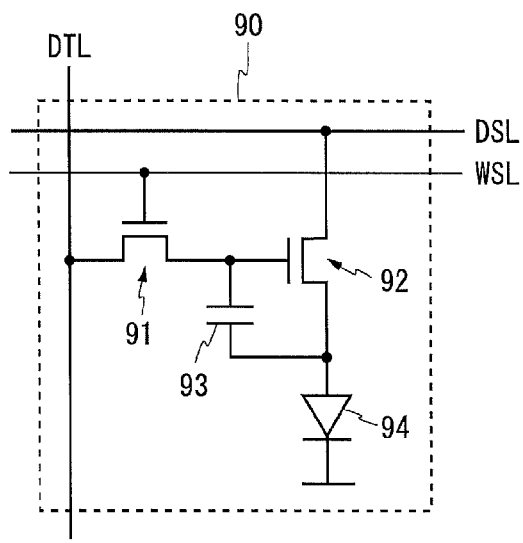
FIG. 22 is a circuit diagram of a pixel circuit included in another conventional display device.

FIG. 20 is a variant of the circuit diagram of the pixel circuit 10 shown in FIG. 2. As shown in FIG. 20, a pixel circuit 20 has approximately the same configuration as the pixel circuit 10 shown in FIG. 2, but the auxiliary capacitor 25 is additionally provided and connected parallel to the organic EL element 16. The auxiliary capacitor 25 has a capacitance value appropriately determined on the basis of the capacitance value of the organic EL element 16 and the capacitance value of the capacitor 15, and the relationship $C_{OLED} \gg C_{st}$ is desirably established. As a result, equation (1) can be transformed to equation (2), and therefore, compensation accuracy can be enhanced by a simplified calculation process.

INDUSTRIAL APPLICABILITY

The present invention relates to display devices, and is suitable for display devices, such as an organic EL display, which include current-driven self-luminous elements, e.g., organic EL elements.

DESCRIPTION OF THE REFERENCE CHARACTERS

1 display control circuit
2 gate driver circuit
3 source driver circuit
4 power control circuit
5 shift register
6 register
7 latch circuit
8 D/A converter
9 common power line
10, 20, 30 pixel circuit
11 TFT (write control transistor)
12 TFT (drive transistor)
13 TFT (emission control transistor)
15 capacitor
16 organic EL element (electro-optic element)
25 auxiliary capacitor
100 display device
$G_i$ scanning signal line
$E_i$ control line
$S_i$ data line
$VP_i$ power line

The invention claimed is:

1. An active-matrix display device comprising:
a plurality of video signal lines for transmitting signals representing an image to be displayed;
a plurality of scanning signal lines and control lines crossing the video signal lines;
a plurality of pixel circuits for forming the image to be displayed, the circuits being arranged in a matrix so as to correspond to intersections of the video signal lines and the scanning signal lines;
a plurality of power lines for supplying power potentials to the pixel circuits;
a scanning signal line driver circuit for selectively or collectively driving the scanning signal lines and the control lines;
a video signal line driver circuit for driving the video signal lines by applying thereto the signals representing the image to be displayed; and
a power control circuit for driving the power lines, wherein, the pixel circuit includes:
an electro-optic element to be driven by current provided via the power line;
a drive transistor provided in a current path through the electro-optic element, to determine current that is to flow through the path;
a write control transistor provided between a control terminal of the drive transistor and the video signal line, to connect the control terminal of the drive transistor and the video signal line when the scanning signal line driver circuit drives and activates the scanning signal line;

an emission control transistor provided between one conductive terminal of the drive transistor and the power line, to connect that conductive terminal and the power line when the scanning signal line driver circuit drives and activates the control line; and a capacitor provided between the other conductive terminal of the drive transistor and the control terminal, the scanning signal line driver circuit collectively drives and activates at least a part of the scanning signal lines and at least a part of the control lines, and thereafter selectively drives the scanning signal lines, thereby displaying the image, the at least a part of the scanning signal lines being collectively driven and activated in an initialization period in which to initialize the electro-optic elements and in a threshold detection period in which to compensate for a threshold voltage of the drive transistors, the initialization period being set so as to be later than a start of a frame period, the threshold detection period being set so as to be later than the initialization period, the at least a part of the control lines being collectively driven and activated in the threshold detection period, the power control circuit provides the power lines with initialization potentials to initialize the electro-optic elements in the initialization period and with the power potentials except in the initialization period, and the emission control transistor is made conductive approximately for the same duration by:

in at least a part of a time period after the threshold detection period until at least a part of the scanning signal lines being each finished selecting, the scanning signal line driver circuit driving and deactivating at least a part of the control lines corresponding to the at least a part of the scanning signal lines; and the scanning signal line driver circuit thereafter collectively driving and activating the at least a part of the control lines in at least a part of a time period until the start of the next initialization period.

2. The display device according to claim 1, wherein, the scanning signal lines and the control lines are divided into a plurality of groups, the scanning signal line driver circuit collectively drives and activates one of the groups of scanning signal lines and one of the groups of control lines in the initialization period and the threshold detection period, and aside from the initialization period and the threshold detection period, one or more different initialization periods and one or more different threshold detection periods are set in which a different group of scanning signal lines and a different group of control lines are collectively driven and activated.

3. The display device according to claim 2, wherein each time the scanning signal lines to be selectively driven and activated to display the image are each finished selecting, the scanning signal line driver circuit drives and activates the control lines corresponding to the scanning signal lines, such that the emission control transistor is made conductive approximately for the same duration.

4. The display device according to claim 2, wherein to avoid any two power lines in the same one of the divided groups of power lines being adjacent to each other, the power lines are sequentially provided one by one from different groups.

5. The display device according to claim 2, further comprising one common power line provided for each group of power lines such that the common power line is commonly connected to that group, wherein, in the initialization period or in the different initialization period, the power control circuit provides the groups of power lines with the initialization potentials via their respective corresponding common power lines.

6. The display device according to claim 1, wherein, the scanning signal lines and the control lines are divided into a plurality of groups, the scanning signal line driver circuit collectively drives and activates one of the groups of scanning signal lines and one of the groups of control lines in the initialization period and the threshold detection period, aside from the initialization period and the threshold detection period, one or more different initialization periods and one or more different threshold detection periods are set in which a different group of scanning signal lines and a different group of control lines are collectively driven and activated, in at least a part of a time period after the different threshold detection period until the different group of scanning signal lines being completely selected, the scanning signal line driver circuit drives and deactivates a group of control lines corresponding to the different group of scanning signal lines, and the scanning signal line driver circuit thereafter collectively drives and activates the group of control lines in at least a part of a time period until the start of the next different initialization period.

7. The display device according to claim 1, further comprising at least one common control line commonly connected to at least a part of the control lines, wherein, the scanning signal line driver circuit drives the common control line, thereby collectively driving the control lines.

8. An active-matrix display device comprising:
a plurality of video signal lines for transmitting signals representing an image to be displayed;
a plurality of scanning signal lines and control lines crossing the video signal lines;
a plurality of pixel circuits for forming the image to be displayed, the circuits being arranged in a matrix so as to correspond to intersections of the video signal lines and the scanning signal lines;
a plurality of power lines for supplying power potentials to the pixel circuits;
a scanning signal line driver circuit for selectively or collectively driving the scanning signal lines and the control lines;
a video signal line driver circuit for driving the video signal lines by applying thereto the signals representing the image to be displayed; and
a power control circuit for driving the power lines, wherein, the pixel circuit includes:
an electro-optic element to be driven by current provided via the power line;
a drive transistor provided in a current path through the electro-optic element, to determine current that is to flow through the path;
a write control transistor provided between a control terminal of the drive transistor and the video signal line, to connect the control terminal of the drive transistor and the video signal line when the scanning signal line driver circuit drives and activates the scanning signal line;
an emission control transistor provided between one conductive terminal of the drive transistor and the power line, to connect that conductive terminal and the power line when the scanning signal line driver circuit drives and activates the control line; and a capacitor provided between the other conductive terminal of the drive transistor and the control terminal, and the scanning signal line driver circuit collectively drives and activates at least a part of the scanning signal lines and at least a part of the control lines, and thereafter selectively drives the scanning signal lines, thereby displaying the image, the at least a part of the scanning signal lines being collectively driven and activated in an initialization period in which to initialize the electro-optic elements and in a threshold detection period in which to compensate for a threshold voltage of the drive transistors, the initialization period being set so as to be later than a start of a frame period, the threshold detection period being set so as to be later than the initialization period, the at least a part of the control lines being collectively driven and activated in the threshold detection period, wherein, the power control circuit only provides the power potentials to the power lines, and the video signal line driver circuit sets the potentials of all of the video signal lines to be high level and greater than a reference potential to be provided to control terminals of the drive transistors, and thereafter changes the potentials of all of the video signal lines to the level of the reference potential at a predetermined point in the initialization period with all of the control lines left deactivated, the reference potential being a potential for bringing the drive transistor into ON state and applying across the electro-optic element a voltage not greater than a threshold therefor.

9. The display device according to claim 1, further comprising an auxiliary capacitor connected parallel to the electro-optic element.

10. A method for driving an active-matrix display device including a plurality of video signal lines for transmitting signals representing an image to be displayed, a plurality of scanning signal lines and control lines crossing the video signal lines, a plurality of pixel circuits for forming the image to be displayed, the circuits being arranged in a matrix so as to correspond to intersections of the video signal lines and the scanning signal lines, and a plurality of power lines for supplying power potentials to the pixel circuits, the method comprising:

a scanning signal line driving step of selectively or collectively driving the scanning signal lines and the control lines;

a video signal line driving step of driving the video signal lines by applying thereto the signals representing the image to be displayed; and a power control step of driving the power lines, wherein, the pixel circuit includes:

an electro-optic element to be driven by current provided via the power line;

a drive transistor provided in a current path through the electro-optic element, to determine current that is to flow through the path;

a write control transistor provided between a control terminal of the drive transistor and the video signal line, to connect the control terminal of the drive transistor and the video signal line when the scanning signal line is driven and activated in the scanning signal line driving step;

an emission control transistor provided between one conductive terminal of the drive transistor and the power line, to connect that conductive terminal and the power line when the control line is driven and activated in the scanning signal line driving step; and a capacitor provided between the other conductive terminal of the drive transistor and the control terminal, and in the scanning signal line driving step, at least a part of the scanning signal lines and at least a part of the control lines are collectively driven and activated, and thereafter the scanning signal lines are selectively driven, thereby displaying the image, the at least a part of the scanning signal lines being collectively driven and activated in an initialization period in which to initialize the electro-optic elements and in a threshold detection period in which to compensate for a threshold voltage of the drive transistors, the initialization period being set so as to be later than a start of a frame period, the threshold detection period being set so as to be later than the initialization period, the at least a part of the control lines being collectively driven and activated in the threshold detection period, in the power control step, the power lines are provided with initialization potentials to initialize the electro-optic elements in the initialization period and with the power potentials except in the initialization period, and the emission control transistor is made conductive approximately for the same duration by:

in at least a part of a time period after the threshold detection period until at least a part of the scanning signal lines being each finished selectin the scanning signal line driver circuit driving and deactivating at least a part of the control lines corresponding to the at least a part of the scanning signal lines; and the scanning signal line driver circuit thereafter collectively driving and activating the at least a part of the control lines in at least a part of a time period until the start of the next initialization period.

11. The display device according to claim 8, further comprising an auxiliary capacitor connected parallel to the electro-optic element.

12. The display device according to claim 10, wherein, the scanning signal lines and the control lines are divided into a plurality of groups, in the scanning signal line driving step, a scanning signal line driver circuit collectively drives and activates one of the groups of scanning signal lines and one of the groups of control lines in the initialization period and the threshold detection period, aside from the initialization period and the threshold detection period, one or more different initialization periods and one or more different threshold detection periods are set in which a different group of scanning signal lines and a different group of control lines are collectively driven and activated, in at least a part of a time period after the different threshold detection period until the different group of scanning signal lines being completely selected, the scanning signal line driver circuit drives and deactivates a group of control lines corresponding to the different group of scanning signal lines, and the scanning signal line driver circuit thereafter collectively drives and activates the group of control lines in at least a part of a time period until the start of the next different initialization period.

* * * * *